(12) United States Patent
Esaka

(10) Patent No.: US 11,249,687 B2
(45) Date of Patent: Feb. 15, 2022

(54) SYSTEM AND METHOD FOR SUPPORTING DATA ANALYSIS

(71) Applicant: Hitachi, Ltd., Tokyo (JP)

(72) Inventor: Tomonori Esaka, Tokyo (JP)

(73) Assignee: HITACHI, LTD., Tokyo (JP)

( * ) Notice: Subject to any disclaimer, the term of this patent is extended or adjusted under 35 U.S.C. 154(b) by 27 days.

(21) Appl. No.: 17/010,020

(22) Filed: Sep. 2, 2020

(65) Prior Publication Data

US 2021/0223993 A1 Jul. 22, 2021

(30) Foreign Application Priority Data

Jan. 20, 2020 (JP) .............................. JP2020-006578

(51) Int. Cl.
| | |
|---|---|
| *G06F 12/00* | (2006.01) |
| *G06F 3/06* | (2006.01) |
| *G06F 8/60* | (2018.01) |
| *H03M 13/15* | (2006.01) |
| *G06N 20/00* | (2019.01) |

(52) U.S. Cl.
CPC .......... *G06F 3/0659* (2013.01); *G06F 3/0604* (2013.01); *G06F 3/067* (2013.01); *G06F 3/0641* (2013.01); *G06F 8/60* (2013.01); *G06N 20/00* (2019.01); *H03M 13/154* (2013.01)

(58) Field of Classification Search
CPC .... G06F 3/0659; G06F 3/0604; G06F 3/0641; G06F 3/067; G06F 8/60; G06F 11/10; G06F 3/065; G06F 3/0608; G06F 3/061; G06N 20/00; H03M 13/154; H03M 13/373
USPC ........................................................ 711/154
See application file for complete search history.

(56) References Cited

U.S. PATENT DOCUMENTS 10,168,945 B2 * 1/2019 Kumagai .............. G06F 3/0683
2017/0060574 A1 3/2017 Malladi et al.
2020/0272662 A1 * 8/2020 Markovic ......... G06F 16/90324

* cited by examiner

*Primary Examiner* — Mardochee Chery
(74) *Attorney, Agent, or Firm* — Mattingly & Malur, PC

(57) ABSTRACT

Every time a node computer receives multidimensional data from a data source, the node computer which has received the multidimensional data in a computer system: writes the multidimensional data; reads the multidimensional data; analyzes the read multidimensional data; and outputs a result of the analysis. Such writing of the multidimensional data is data locality EC processing (Erasure Coding with data locality). The data locality EC processing is to: write all of one or more data chunks constituting the multidimensional data to the node computer; and write a parity of the data chunk, with respect to each of the one or more data chunks, to a node computer(s) other than the node computer.

14 Claims, 18 Drawing Sheets

FIG. 8

AI ALGORITHM MANAGEMENT TABLE
800

| AI ALGORITHM ID | AI-ID | CREATION DATE AND TIME | LEARNING DATASET ID | ANALYSIS RESULT ID |
|---|---|---|---|---|
| P-10000 | P100 | 2019/10/01 10:00:00 | D-10000 | A-10000 |
| Q-10000 | Q100 | 2019/10/02 10:00:00 | D-20000 | A-20000 |
| ... | ... | ... | ... | ... |

LEARNING DATASET MANAGEMENT TABLE
900

| LEARNING DATASET ID | STILL IMAGE DATE AND TIME | MOVING IMAGE DATE AND TIME | RELATED DATE AND TIME | PUBLISHED DATE AND TIME |
|---|---|---|---|---|
| D-10000 | 2019/09/30 10:00:00 | 2019/09/30 10:00:00 | 2019/09/30 10:00:00 | 2019/09/30 10:00:00 |
| D-20000 | 2019/09/30 10:00:00 | 2019/09/30 10:00:00 | 2019/09/30 10:00:00 | 2019/09/30 10:00:00 |
| ... | ... | ... | ... | ... |

ANALYSIS RESULT MANAGEMENT TABLE
1000

| ANALYSIS RESULT ID | ANALYSIS DATE AND TIME | AI-ID | AI ALGORITHM ID | CUSTOMER NAME |
|---|---|---|---|---|
| A-10000 | 2019/11/01 10:00:00 | P100 | P-10000 | Aaa |
| A-20000 | 2019/11/02 10:00:00 | Q100 | Q-10000 | Aaa |
| ... | ... | ... | ... | ... |

FIG. 11

NODE STATUS MANAGEMENT TABLE
1100

| NODE NAME | AVERAGE PROCESSOR UTILIZATION RATE | INTRA-NODE FREE CAPACITY | INTRA-NODE USED CAPACITY |
|---|---|---|---|
| NODE 1 | 60% | 60TB | 40TB |
| NODE 2 | 50% | 80TB | 20TB |
| NODE 3 | 20% | 90TB | 10TB |
| NODE 4 | 40% | 70TB | 30TB |
| ... | ... | ... | ... |

FIG. 12

VM MANAGEMENT TABLE
1200

| VM NAME | NODE NAME | VOL CAPACITY | VOL USED CAPACITY |
|---|---|---|---|
| VM1 | NODE 1 | 100TB | 20TB |
| VM2 | NODE 2 | 100TB | 20TB |
| VM3 | NODE 3 | 100TB | 10TB |
| VM4 | NODE 4 | 100TB | 30TB |
| VM5 | NODE 1 | 100TB | 20TB |
| ... | ... | ... | ... |

SYSTEM AND METHOD FOR SUPPORTING DATA ANALYSIS

CROSS-REFERENCE TO PRIOR APPLICATION

This application relates to and claims the benefit of priority from Japanese Patent Application number 2020-006578, filed on Jan. 20, 2020 the entire disclosure of which is incorporated herein by reference.

BACKGROUND

The present invention generally relates to a computer technology for supporting data analysis.

There is a case where it is desired that an edge system should analyze data collected from a data source (such as a sensor group). Reference 1 discloses a technology for enabling intelligence at the edge.

Reference 1: US2017/0060574

SUMMARY

There may be a case where the data collected from the data source is multidimensional data, for example, still image/moving image data which is at least one of still image data and moving image data. Then, there may be case where it is required to analyze such still image/moving image data on a real-time basis by using AI (Artificial Intelligence).

In order for the edge system to analyze data on a real-time basis by using the AI, an IT (Information Technology) infrastructure with high performance (particularly, low latency) is required as the edge system.

When the performance is emphasized, a mirror configuration (data duplication) may be conceivable. However, the mirror configuration has bad capacity efficiency. Particularly, when the data from the data source is large-sized data such as still image/moving image data, the IT infrastructure for the edge system requires a large capacity capable of storing the data even if such data is duplicated.

There is EC (Erasure Coding) as a method for improving the capacity efficiency. According to an EC configuration, write target data is divided into a plurality of data chunks and the plurality of data chunks are distributed and deployed at a plurality of node computers. Therefore, communication between the node computers is required when reading data; and their performance (particularly, reading performance) is low.

The above-described problem may possibly occur also with computer systems other than the edge system. Furthermore, the multidimensional data other than the still image/ moving image data may possibly be, for example, sound data.

Every time a computer system which has a plurality of node computers receives multidimensional data from a data source, the computer system writes the multidimensional data to a logical storage space based on a plurality of physical storage spaces possessed by the plurality of node computers, reads the multidimensional data from the logical storage space, analyzes the read multidimensional data, and outputs the analysis result. Writing the multidimensional data is data locality EC processing (write processing as the EC with data locality). The data locality EC processing is to: write all of one or more data chunks which constitute the multidimensional data to a physical storage space in the node computer; generate a parity for the data, with respect to each of the one or more data chunks, on the basis of the data chunk and one or more data chunks possessed by one or more node computers other than the node computer; and write the generated parity to a physical storage space in the node computer(s) other than the node computer.

The present invention can realize both high performance and high capacity efficiency and enables real-time analysis of the multidimensional data.

BRIEF DESCRIPTION OF THE DRAWINGS

FIG. 8 illustrates the structure of an AI algorithm management table;
FIG. 9 illustrates the structure of a learning dataset management table;
FIG. 10 illustrates the structure of an analysis result management table;
FIG. 11 illustrates the structure of a node status management table;
FIG. 12 illustrates the structure of a VM management table.

DESCRIPTION OF EMBODIMENTS

Figure 1:
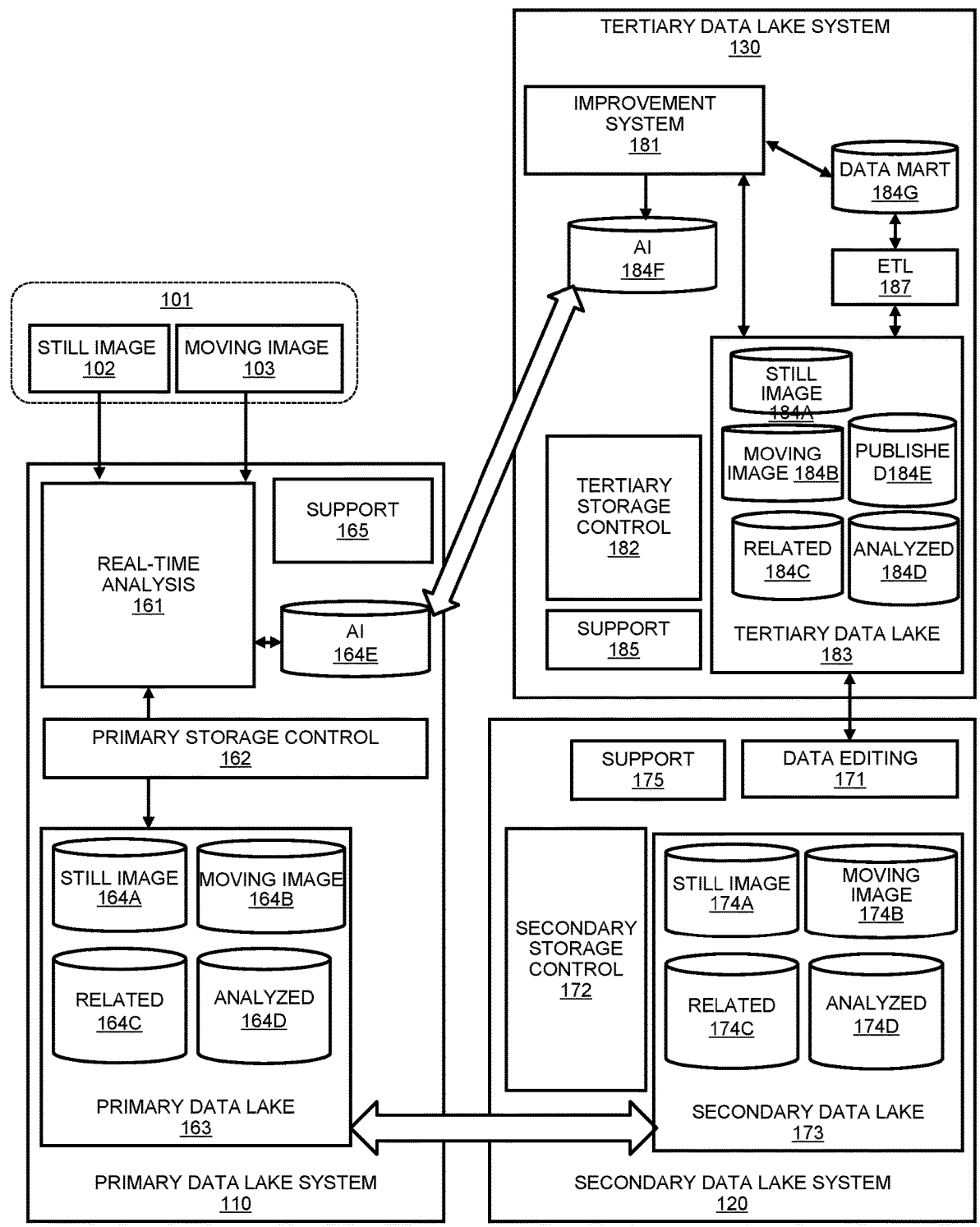
FIG. 1 illustrates the configuration of the entire system according to an embodiment.

In the following explanation, a "communication interface apparatus" may be one or more communication interface devices. The one or more communication interface devices may be one or more communication interface devices of the same type (for example, one or more NICs (Network Interface Cards)) or two or more communication interface devices of different types (for example, NIC and HBA [Host Bus Adapter]).

Furthermore, in the following explanation, a "memory" is one or more memory devices, which are an example of one or more storage devices, and may typically be a main storage device. At least one memory device in the memory may be a volatile memory device or a nonvolatile memory device.

Furthermore, in the following explanation, a "persistent storage apparatus" may be one or more persistent storage devices which are an example of one or more storage devices. The persistent storage device may typically be a nonvolatile storage device (such as an auxiliary storage device) and may specifically be, for example, an HDD (Hard Disk Drive), SSD (Solid State Drive), NVMe (Non-Volatile Memory Express) drive, or SCM (Storage Class Memory).

Furthermore, in the following explanation, a "storage apparatus" may be a memory and at least a memory for the persistent storage apparatus.

Furthermore, in the following explanation, a "processor" may be one or more processor devices. At least one processor device may typically be a microprocessor device such as a CPU (Central Processing Unit) or a processor device of other types such as a GPU (Graphics Processing Unit). At least one processor device may be single-core or multi-core. At least one processor device may be a processor core. At least one processor device may be a processor device in a broad sense such as a circuit which is a gate array assembly using a hardware description language to execute part or whole of processing (for example, FPGA [Field-Programmable Gate Array], CPLD [Complex Programmable Logic Device], or ASIC [Application Specific Integrated Circuit]).

Furthermore, in the following explanation, information which is output in response to input will sometimes be explained by using the expression "xxx table"; however, such information may be data of any structure (for example, such data may be structured data or unstructured data) or may be a learning model(s) represented by a neural network(s), a genetic algorithm(s), or a random forest(s) which causes output in response to input. Therefore, "xxx table" can be called "xxx information." Furthermore, in the following explanation, the structure of each table is an example; and one table may be divided into two or more tables or all or some of two or more tables may be one table.

Furthermore, in the following explanation, a function(s) will be sometimes explained by using the expression "yyy unit"; however, the function(s) may be implemented by execution of one or more computer programs by a processor, may be implemented by one or more hardware circuits (such as FPGA or ASIC), or may be implemented by a combination of the execution of one or more computer programs by the processor and the one or more hardware circuits. If the function is implemented by the execution of the program(s) by the processor, specified processing is executed by using, for example, a storage apparatus and/or an interface apparatus as appropriate; and, therefore, the function may be recognized as at least part of the processor. The processing explained by referring to the function as a subject may be processing executed by the processor or an apparatus having that processor. The program(s) may be installed from a program source. The program source may be, for example, a program distribution computer or a computer-readable recording medium (such as a non-transitory recording medium). The explanation about each function is an example; and a plurality of functions may be integrated into one function or one function may be divided into a plurality of functions.

Furthermore, when elements of the same type are explained without distinguishing one from another in the following explanation, a reference numeral (reference numeral of double-digits or more) or a common reference numeral in reference numerals is used; and when the elements of the same type are distinguished one from another, an identification reference numeral (one-digit reference numeral) of the relevant element or the entire reference numeral is sometimes used.

Furthermore, in the following explanation, a node computer(s) will be called simply as a "node(s)."

FIG. 1 illustrates the configuration of the entire system according to an embodiment. Incidentally, in this embodiment, still image/moving image data is adopted as multidimensional data.

There are a primary data lake system 110, a secondary data lake system 120, and a tertiary data lake system 130. The secondary data lake system 120 and the tertiary data lake system 130 may be provided in the same cloud environment (for example, a public cloud) or a cloud environment in which the secondary data lake system 120 is provided may be different from a cloud environment in which the tertiary data lake system 130 is provided. At least one of the secondary data lake system 120 and the tertiary data lake system 130 may be provided in an environment other than the cloud environment.

A primary IT infrastructure (an IT infrastructure in which the primary data lake system 110 is provided) is configured of a plurality of nodes as described later (see FIG. 2). A secondary IT infrastructure (an IT infrastructure in which the secondary data lake system 120 is provided) and a tertiary IT infrastructure (an IT infrastructure in which the tertiary data lake system 130 is provided) may be the same IT infrastructure or different IT infrastructures. The secondary IT infrastructure and the tertiary IT infrastructure may have the same configuration as, or different configurations from, that of the primary IT infrastructure. In this embodiment, it is assumed that the primary IT infrastructure, the secondary IT infrastructure, and the tertiary IT infrastructure have the same configuration so as to facilitation cooperation between the primary data lake system 110 and the secondary data lake system 120, cooperation between the secondary data lake system 120 and the tertiary data lake system 130, and cooperation between the tertiary data lake system 130 and the primary data lake system 110. Furthermore, it is assumed that the secondary data lake system 120 and the tertiary data lake system 130 are in the cloud environment.

The outline of this embodiment is, for example, as described below. Incidentally, in the following explanation, a "VOL" is an abbreviation of a logical volume and its details will be explained later. Also, at least one VOL may be a "repository."

When it is desired that real-time analysis should be performed by AI by using the still image/moving image data in an edge environment, the IT infrastructure which realizes both high performance and high capacity efficiency is required. The mirror configuration has bad capacity efficiency because data is duplicated; and the EC (Erasure Coding) has bad reading performance because a plurality of data chunks which constitute the still image/moving image data are distributed to a plurality of nodes and inter-node communication occurs every time data is read.

So, in this embodiment, the primary data lake system 110 executes data locality EC processing which is write processing as the EC with data locality. According to the data locality EC processing, still image/moving image data, which is a target to be written to a node, is stored in that node and a plurality of parities respectively corresponding to a plurality of data chunks which constitute the still image/moving image data are stored in nodes other than the relevant node mentioned above. Therefore, the still image/moving image data can be read from a single node, so that the inter-node communication is unnecessary and it is thereby possible to realize the high performance (low latency). Also, the EC with the data locality can realize the high capacity efficiency.

Furthermore, the primary data lake system 110 is a so-called HCI (Hyper-Converged Infrastructure) which includes both an application system and a storage control system. The IT infrastructure as hardware of the HCI is a foundation configured of a plurality of nodes and there is no need to construct a highly-reliable IT system by connecting a server product, a storage product, and a switch product. In many cases, it is thought that engineers or operation administrators who have high IT skills do not generally exist in the edge environment. So, it is easy to introduce the primary data lake system 110 as the HCI into the edge environment.

The HCI deployed in the edge environment (the HCI equipped with the EC with the data locality) uses AI to perform the real-time analysis of the still image/moving image data collected in the edge environment. In order to prevent capacity enlargement of the HCI in the edge environment, the primary data lake system 110 archives the data in, for example, the secondary data lake system 120 (for example, the HCI equipped with the EC with the data locality) deployed in the cloud environment. Under this circumstance, data transfer capacity upon remote copying is reduced by the remote copy processing in cooperation with deduplication processing.

The secondary data lake system 120: edits the data archived in the secondary data lake system 120 in the cloud environment as necessary; and provides the edited data as AI learning data to the tertiary data lake system 130 which can be used by a specified user such as an equipment manufacturer who provides the data source 101 in the edge environment. The tertiary data lake system 130 uses the provided data to make the AI learn the data, creates an improved AI algorithm, and stores the created AI algorithm in an AI algorithm VOL 184F of the cloud environment. The tertiary data lake system 130 copies the AI algorithm in the AI algorithm VOL 184F to an AI algorithm VOL 164E in the edge environment. The primary data lake system 110 enhances analysis precision by performing the real-time analysis using the improved AI algorithm.

Moreover, the primary data lake system 110 stores analysis result data indicating the analysis result using the improved AI algorithm in an analysis result VOL 164D. The analysis result data is provided from the primary data lake system 110 via the secondary data lake system 120 to the tertiary data lake system 130. The user such as an equipment manufacturer can verify whether the improved AI algorithm has operated as expected by browsing or using the analysis result data provided to the tertiary data lake system 130.

Furthermore, in this embodiment, an application deployment support unit supports optimization of application deployment in order to maintain the high performance of the HCI equipped with the EC with data locality.

This embodiment will be explained below in detail. Every one of the primary data lake system 110, the secondary data lake system 120, and the tertiary data lake system 130 may be the HCI equipped with the EC with the data locality. Furthermore, in this embodiment, it is assumed that a "source supplier" who supplies the data source 101, a "system supplier" who provides the system including the data lake systems 110, 120, and 130 and a "system user" who introduces the primary data lake exist.

The primary data lake system 110 receives data from the data source 101. The data source 101 includes, for example, image capturing equipment 102 which captures still images and outputs still image data representing the captured still images, and moving image capturing equipment 103 which captures moving images and outputs moving image data representing the captured moving images. Therefore, the data received from the data source 101 is still image/moving image data which is at least one of the still image data and the moving image data.

The primary data lake system 110 includes a real-time analysis system 161, a primary storage control system 162, and an application deployment support unit 165. The primary storage control system 162 executes the data locality EC processing, deduplication, and remote copying (for example, copying from a primary data lake 163 to a secondary data lake 173). The primary storage control system 162 provides the primary data lake 163 and the AI algorithm VOL 164E. An AI algorithm for data analysis is stored in the AI algorithm VOL 164E. The AI algorithm is an example of a learning model. The learning model may be a model created by using a known learning method and may be, for example, an autoregressive moving-average model (such as an ARIMA [Autoregressive Integrated Moving Average] model) or a neural network.

Every time the real-time analysis system 161 receives the still image/moving image data from the data source 101, the real-time analysis system 161: writes the relevant still image/moving image data to the primary data lake 163, reads the relevant still image/moving image data from the primary data lake 163, and analyzes the read still image/moving image data according to the AI algorithm in the AI algorithm VOL 164. The real-time analysis system 161 writes, for example, analysis result data representing the analysis result to the primary data lake 163.

The primary data lake 163 includes, for example, a still image VOL 164A which stores the still image data, a moving image VOL 1648 which stores the moving image data, a related VOL 164C which stores related data of the still image/moving image data, and an analyzed VOL 164D which stores the analysis result data representing the analysis result by the real-time analysis system 161. Under this circumstance, a "VOL" is an abbreviation of a logical volume and may be a logical storage device. The VOL may be a real VOL (RVOL) or may be a virtual VOL (VVOL). The "RVOL" may be a VOL based on a physical storage space possessed by the IT infrastructure for the system which provides that RVOL. The "VVOL" is composed of a plurality of virtual areas (virtual storage areas) and may be a VOL according to capacity virtualization technology (typically, Thin Provisioning). A "pool" may be a storage area composed of a plurality of real areas (real storage areas) and may be, for example, a set of a plurality of pool VOLs. A real area may be allocated to a virtual area which is a VVOL write destination; and write target data may be written to the allocated real area. A "pool VOL" is a VOL which is a constituent element of a pool and is, for example, an RVOL. In this embodiment, Each of VOLs 164A to 164E is a VVOL. Data stored in a VVOL is stored, via a pool VOL which is not illustrated in the drawing, in a physical storage space possessed by a node.

Reading/writing of data from/to the VOL 164 is performed by the primary storage control system 162. For example, reading/writing of data from/to the VOL 164 by the real-time analysis system 161 is performed via the primary storage control system 162.

The application deployment support unit 165 supports the optimization of deployment of applications which operate in the primary IT infrastructure. For example, two or more applications which operate in the primary IT infrastructure are the real-time analysis system 161. In other words, the real-time analysis system 161 is implemented by the two or more applications executed at two or more nodes. An application is typically an application program. Incidentally, the "two or more applications" herein used are an example in which the application deployment support unit 165 functions. The real-time analysis system 161 may be implemented by one application. For example, an example where there is one application can be an application which operates at a plurality of nodes like a Hadoop application. The data locality EC functions even if there is one application.

The secondary data lake system 120 includes a data editing unit 171, a secondary storage control system 172, and an application deployment support unit 175. The secondary storage control system 172 executes the data locality EC processing, deduplication, and remote copying. The secondary storage control system 172 provides a secondary data lake 173. The data editing unit 171 reads data from the secondary data lake 173 and edits the read data (for example, deletes data which matches specified conditions). The edited data is stored in the tertiary data lake system 130.

The application deployment support unit 175 supports the optimization of deployment of applications which operate in the secondary IT infrastructure.

The secondary data lake 173 includes, for example, a still image VOL 174A which is an archive destination of the still image data in the still image VOL 164A, a moving image VOL 174B which is an archive destination of the moving image data in the moving image VOL 164B, a related VOL 174C which is an archive destination of the related data in the related VOL 164C, and an analyzed VOL 174D which is an archive destination of the analysis result data in the analyzed VOL 164D. Reading/writing of data from/to the secondary data lake 173 is performed by the secondary storage control system 172.

Reading/writing of data from/to the VOL 174 is performed by the secondary storage control system 172. For example, reading of data from the VOL 174 by the data editing unit 171 is performed via the secondary storage control system 172.

The tertiary data lake system 130 includes an improvement system 181, a tertiary storage control system 182, an application deployment support unit 185, and an ETL (Extract/Transform/Load) unit 187. The tertiary storage control system 182 executes the data locality EC processing, deduplication, and remote copying (for example, remote copying from an AI algorithm VOL 184F to the AI algorithm VOL 164E). The tertiary storage control system 182 provides a tertiary data lake 183 and the AI algorithm VOL 184F. Furthermore, the tertiary storage control system 182 can also provide a data mart VOL 184G which is a storage place of data obtained through ETL from the tertiary data lake 183. The ETL unit 187 stores the data, which is obtained by ETL with respect to the data in the tertiary data lake 183, in the data mart VOL 184G.

The improvement system 181 improves an AI algorithm by using a learning dataset and stores data representing the improved AI algorithm in the AI algorithm VOL 184F. The learning dataset is a snapshot of at least part of the tertiary data lake 183. The learning dataset may include at least part of the data mart VOL 184G.

The tertiary data lake 183 includes, for example, a still image VOL 184A which is a storage location of the still image data in the still image VOL 174A or its edited data, a moving image VOL 184B which is a storage location of the moving image data in the moving image VOL 174B or its edited data, a related VOL 184C which is a storage location of the relate data in the related VOL 174C or its edited data, and an analyzed VOL 184D which is a storage location of the analysis result data in the analyzed VOL 174D or its edited data. Furthermore, the tertiary data lake 183 includes a published VOL 184E in which data published on the Web is stored.

Reading/writing of data from/to the VOL 184 is performed by the tertiary storage control system 182. For example, reading/writing of data to the VOL 184 by the improvement system 181 and the ETL unit 187 is performed via the tertiary storage control system 182.

The application deployment support unit 185 supports the optimization of deployment of applications which operate in the tertiary IT infrastructure. For example, two or more applications which operate in the tertiary IT infrastructure are the improvement system 181. In other words, the improvement system 181 is implemented by the two or more applications executed at two or more nodes. Incidentally, the "two or more applications" used herein are one example in which the application deployment support unit 185 functions. The improvement system 181 may be implemented by one application.

The configuration of the entire system has been explained above. Incidentally, as one example, at least one of the following may be adopted.

At least one of the application deployment support units 175 and 185 may not exist.

The ETL unit 187 may not exist.

The data editing unit 171 may not exist.

At least one of the related VOL, the analyzed VOL, and the published VOL may not exist.

Figure 2:
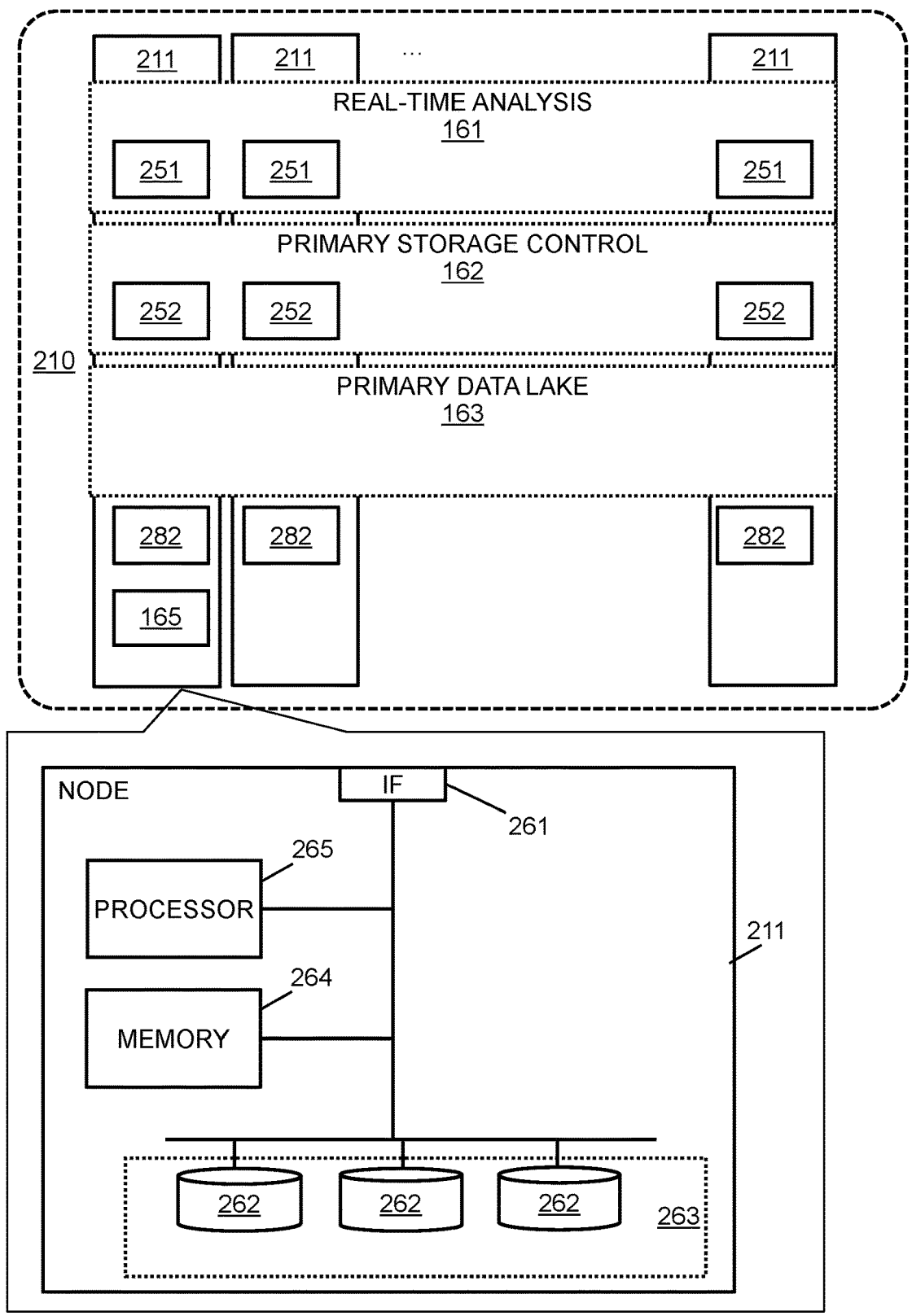
FIG. 2 illustrates the configuration of a primary IT infrastructure.

FIG. 2 illustrates the configuration of a primary IT infrastructure.

A primary IT infrastructure 210 is composed of a plurality of nodes 211. The node(s) 211 may be, for example, a general-purpose computer. The node 211 includes, for example, an IF (communication interface apparatus) 261, a persistent storage apparatus 263, a memory 264, and a processor 265 coupled to these elements. The persistent storage apparatus 263 includes one or more persistent storage devices 262. The persistent storage apparatus 263 provides a physical storage space(s). A storage control unit 252 is implemented by execution of an application(s) 251 by the processor 265.

For example, the real-time analysis system 161, the primary storage control system 162, and the primary data lake 163 extend across the plurality of nodes 211.

The real-time analysis system 161 is implemented by a plurality of applications 251.

One or more applications 251 are deployed at one node 211. The real-time analysis system 161 may be implemented by at least one application 251. In other words, the plurality of applications 251 may also implement another application system in addition to the real-time analysis system 161. Furthermore, the real-time analysis system 161 may be implemented by the application 251, like a Hadoop application, which extends across a plurality of nodes 211.

The primary storage control system 162 is implemented by a plurality of storage control units 252. The storage control unit 252 is, for example, an SDS (Software Defined Storage). Each node 211 has the storage control unit 252.

A hypervisor 282 is executed on each node 211. The hypervisor 282 can create a VM (Virtual Machine), migrate the VM between the nodes 211, and delete the VM.

Any one of the nodes 211 may have the application deployment support unit 165. The application deployment support unit 165 may extend across two or more nodes 211.

Figure 3:
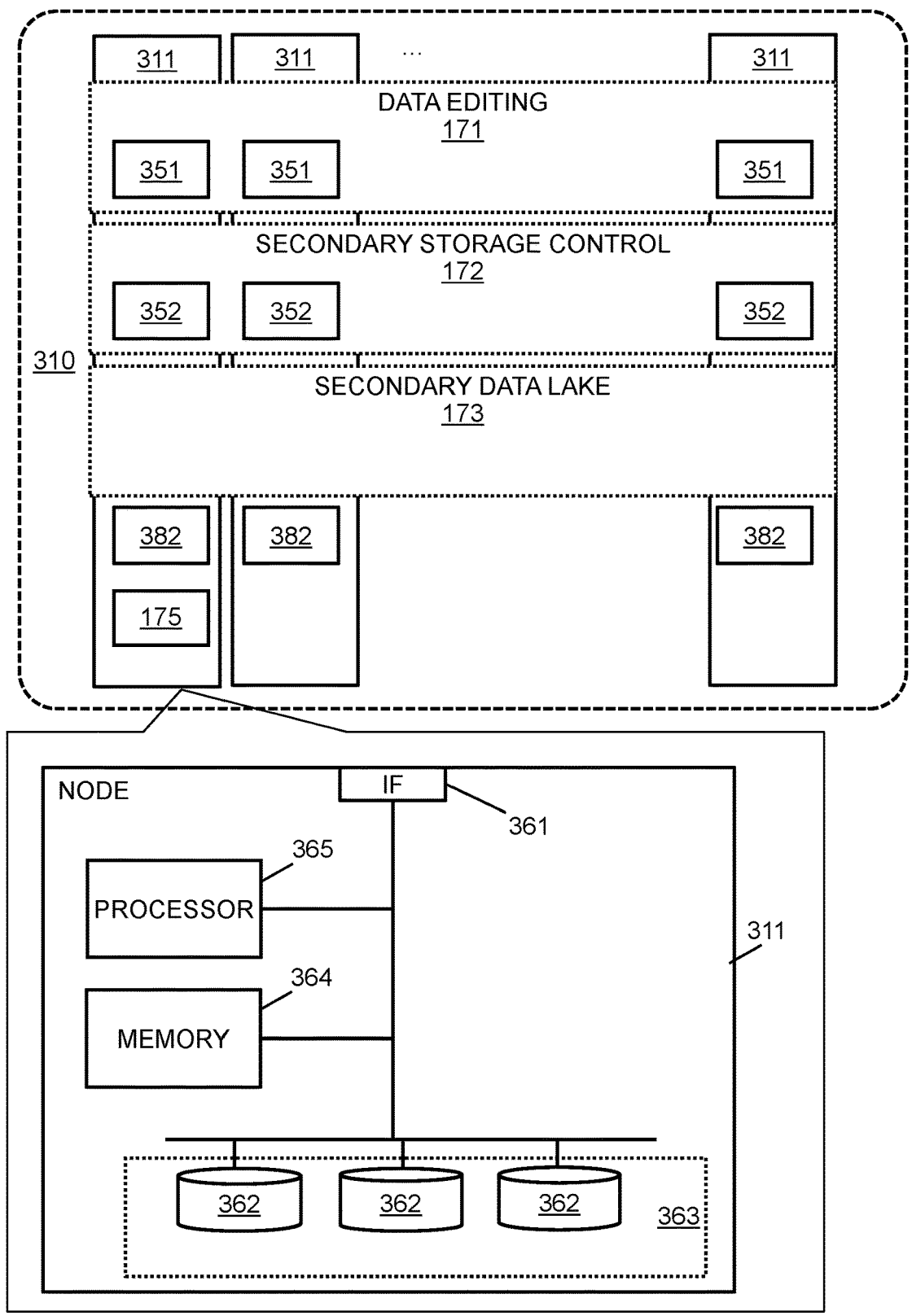
FIG. 3 illustrates the configuration of a secondary IT infrastructure.

FIG. 3 illustrates the configuration of a secondary IT infrastructure.

A secondary IT infrastructure 310 is composed of a plurality of nodes 311. The node(s) 311 may be, for example, a general-purpose computer. The node 311 includes, for example, an IF 361, a persistent storage apparatus 363, a memory 364, and a processor 365 coupled to these elements. The persistent storage apparatus 363 includes one or more persistent storage devices 362. The persistent storage apparatus 363 provides a physical storage space(s). A storage control unit 352 is implemented by execution of an application(s) 351 by the processor 365.

For example, the data editing unit 171, the secondary storage control system 172, and the secondary data lake 173 extend across the plurality of nodes 311.

The data editing unit 171 is implemented by a plurality of applications 351. One or more applications 351 are deployed at one node 311.

The secondary storage control system 172 is implemented by a plurality of storage control units 352. The storage control unit 352 is, for example, an SDS. There is a storage control unit 352 at each node 311.

A hypervisor 382 is executed on each node 311. The hypervisor 382 can create a VM which is an example of the execution environment for the application 351, migrate the VM between the nodes 311, and delete the VM.

Any one of the nodes 311 may have the application deployment support unit 175. The application deployment support unit 175 may extend across two or more nodes 311.

Figure 4:
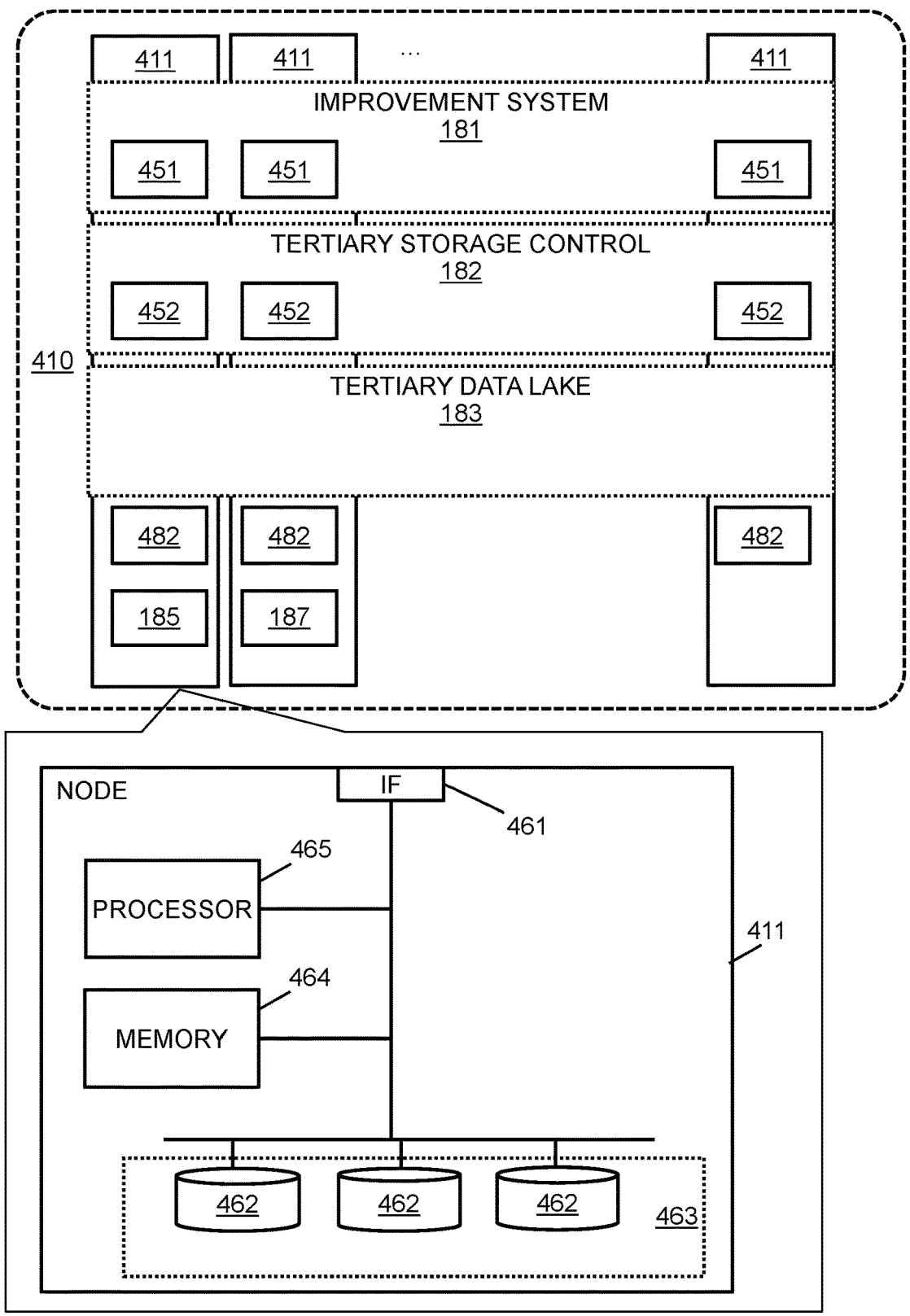
FIG. 4 illustrates the configuration of a tertiary IT infrastructure.

FIG. 4 illustrates the configuration of a tertiary IT infrastructure.

A tertiary IT infrastructure 410 is composed of a plurality of nodes 411. The node(s) 411 may be, for example, a general-purpose computer. The node 411 includes, for example, an IF 461, a persistent storage apparatus 463, a memory 464, and a processor 465 coupled to these elements. The persistent storage apparatus 463 includes one or more persistent storage devices 462. The persistent storage apparatus 463 provides a physical storage space(s). A storage control unit 452 is implemented by execution of an application(s) 451 by a processor 465.

For example, the improvement system 181, the tertiary storage control system 182, and the tertiary data lake 183 extend across a plurality of nodes 411.

The improvement system 181 is implemented by a plurality of applications 451. One or more applications 451 are deployed at one node 411. The improvement system 181 may be implemented by at least one application 451. In other words, the plurality of applications 451 may implement another application system in addition to the improvement system 181. Furthermore, the improvement system 181 may be implemented by the application 451, like a Hadoop application, which extends across a plurality of nodes 411.

The tertiary storage control system 182 is implemented by a plurality of storage control units 452. The storage control unit 452 is, for example, an SDS. There is a storage control unit 452 at each node 411.

A hypervisor 482 is executed on each node 411. The hypervisor 482 can create a VM which is an example of the execution environment for the application 451, migrate the VM between the nodes 411, and delete the VM.

Any one of the nodes 411 may have the application deployment support unit 185. The application deployment support unit 185 may extend across two or more nodes 411.

Furthermore, any one of the nodes 411 may have the ETL unit 187. The ETL unit 187 may extend across two or more nodes 411.

An example of processing executed by the primary data lake system 110 will be explained with reference to FIG. 5 to FIG. 7. Incidentally, processing similar to the processing explained in FIG. 5 to FIG. 7 may be executable by either one of the secondary data lake system 120 and the tertiary data lake system 130.

Figure 5:
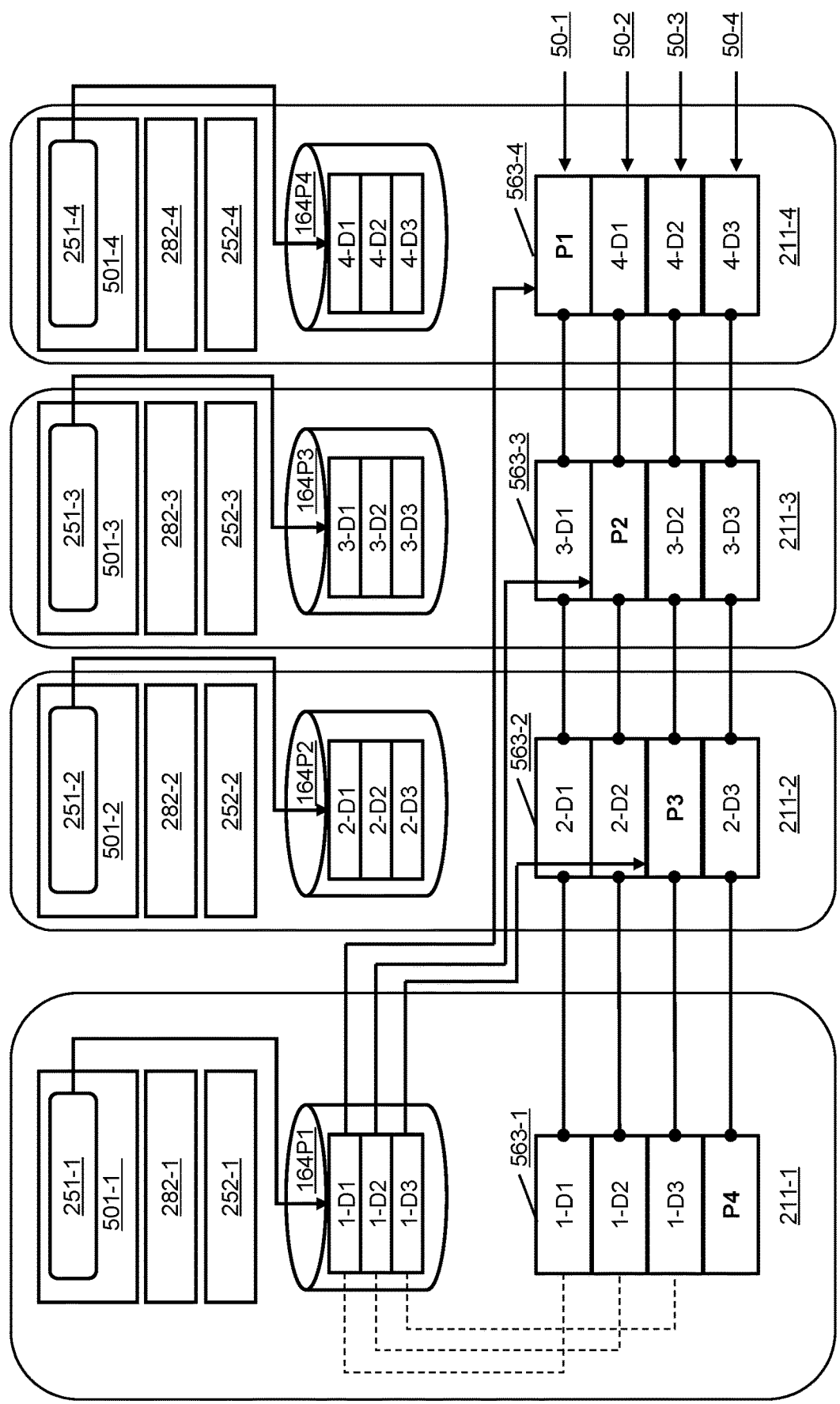
FIG. 5 illustrates an example of data locality EC processing.

FIG. 5 illustrates an example of the data locality EC processing.

The data locality EC processing implements a redundancy group which stores data configured and made redundant by a plurality of physical storage spaces 563-1 to 563-4 possessed by a plurality of nodes 211-1 to 211-4, respectively. The plurality of physical storage spaces 563-1 to 563-4 have a plurality of stripes 50-1 to 50-4. A "stripe" is a storage area extending across the plurality of physical storage spaces 563-1 to 563-4 and is composed of a plurality of strips which are possessed by the plurality of physical storage spaces 563-1 to 563-4, respectively. A "strip" is part of one physical storage space 563. It is assumed that one data chunk or parity is stored in one strip. In other words, the size of a strip may be the same as the size of each data chunk and each parity.

For example, there is a VM 501 generated by the hypervisor 282 at each of the nodes 211-1 to 211-4 and the application 251 is executed at the VM 501. Furthermore, pool VOLs 164P1 to 164P4 exist at the nodes 211-1 to 211-4.

The data locality EC processing is executed at each node 211. The node 211-1 will be taken as an example. When an application 251-1 writes still image/moving image data, a storage control unit 252-1 receives a request to write the relevant still image/moving image data from a VM 501-1 which executes the application 251-1, and writes the relevant still image/moving image data (data chunks 1-D1 to 1-D3) to a pool VOL 164P1 possessed by the node 211-1. The storage control unit 252-1 writes all the data chunks 1-D1 to 1-D3 to the physical storage space 563-1 possessed by the node 211-1. Furthermore, the storage control unit 252-1 writes parities P1 to P3, which correspond to the data chunks 1-D1 to 1-D3, respectively, to the physical storage spaces 563-2 to 563-4 possessed by the nodes 211-2 to 211-4, respectively, other than the node 211-1.

Regarding each data chunk 1-D, a write destination strip of the parity based on the relevant data chunk 1-D is any one strip in a stripe including the write destination strip of the relevant data chunk 1-D.

Regarding each data chunk 1-D, a parity is based on all the data chunks (including the relevant data chunk 1-D) in the stripe including the write destination strip of the relevant data chunk 1-D. For example, according to the stripe 50-1, parity P1 is based on all the data chunks 1-D1, 2-D1, and 3-D1 in the relevant stripe 50-1. In other words, regarding each data chunk 1-D, a parity is based on, besides the relevant data chunk 1-D, the respective data chunks (the data chunks written to the same stripe) of one or more nodes 211 other than the node 211-1 (for example, all the nodes 211 obtained by excluding the same number of nodes as the number of parities generated per stripe from the nodes 211 other than the node 211-1). If a data chunk has not been stored yet in a certain strip, a parity is generated in the relevant strip on the basis of specified data (for example, data whose all bits are "0") (such parity may be called an "intermediate parity").

Therefore, regarding each stripe, if a data chunk in any one of strips in the relevant stripe is updated, the parity in the relevant stripe is updated by the storage control unit 252 which has updated the relevant data chunk.

According to the data locality EC processing illustrated in FIG. 5, inter-node communication occurs when writing data (for example, the data chunks 1-D1 to 1-D3). This is because the storage control unit 252-1 writes a parity based on the relevant data chunk 1-D, for each data chunk 1-D constituting the relevant data, to the nodes 211 other than the node 211 having the relevant storage control unit 252-1. On the other hand, when reading the data (the data chunks 1-D1 to 1-D3), the storage control unit 252-1 can read the relevant data from the physical storage space 563-1 of the single node 211-1. Specifically speaking, the inter-node communication is unnecessary when reading the data.

Figure 6:
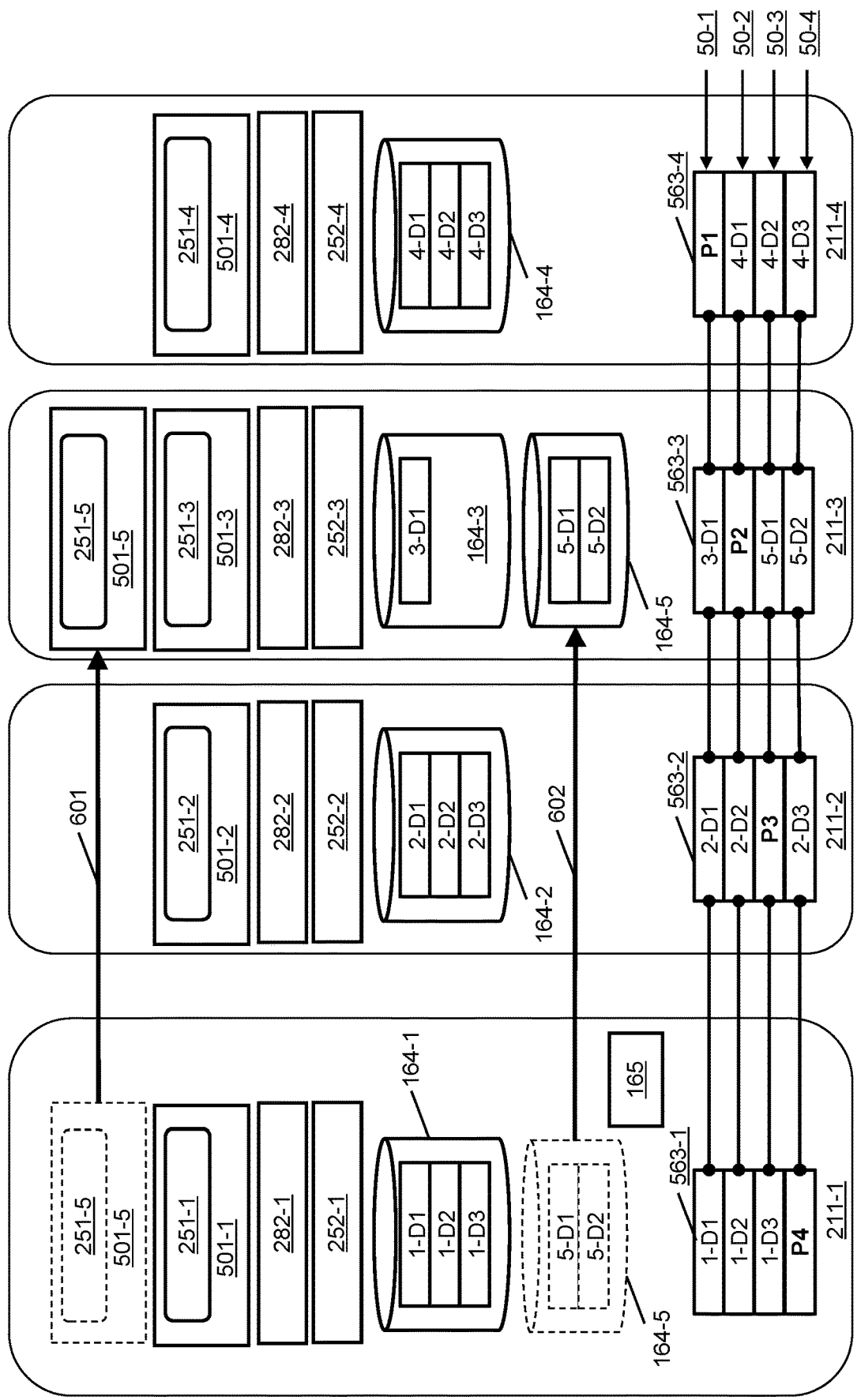
FIG. 6 illustrates an example of application deployment support.

FIG. 6 illustrates an example of application deployment support.

According to the application deployment support illustrated in FIG. 6, the application deployment support unit 165 monitors an intra-node used capacity (an example of a write amount) of each of the nodes 211-1 to 211-4. If variations of the intra-node used capacity have reached a certain degree, the application deployment support unit 165 causes the hypervisor 282 implement the VM migration and the VOL migration. Specifically, for example, the details are as described below.

The application deployment support unit 165 detects that the variations of the intra-node used capacity have reached a certain degree.

In this case, the application deployment support unit 165 selects the node 211-1 with the largest intra-node used capacity (for example, the node 211-1 which stores five data chunks) as a migration source node and selects the node 211-3 with the smallest intra-node used capacity (for example, the node 211-3 which stores one data chunk) as a migration destination node.

Furthermore, the application deployment support unit 165 selects a VM by which leveling of the intra-node used capacity can be expected most by migrating a VOL mounted in that VM, as a VM to be migrated from the migration source node 211-1 to the migration destination node 211-3. Under this circumstance, the migration source node 211-1 has a VM 501-1 in which a VOL 164-1 storing three data chunks is mounted, and a VM 501-5 in which a VOL 164-5 storing two data chunks is mounted; and to make the VM 501-5 a migration target contributes most to the leveling of the intra-node used capacity. This is because if the VM 501-5 and the VOL 164-5 are migrated from the migration source node 211-1 to the migration destination node 211-3, all the nodes 211-1 to 211-4 will have the intra-node used capacity of three data chunks, respectively. The application deployment support unit 165 causes at least one of a hypervisor 282-1 for the migration source and a hypervisor 282-3 for the migration destination to execute the migration of the VM 501-5 from the node 211-1 to the node 211-3. At least one of the hypervisors 282-1 and 282-3 migrates the VM 501-5 from the node 211-1 to the node 211-3 (arrow 601) and also migrates the VOL 164-5, which is mounted in the VM 501-5, from the node 211-1 to the node 211-3 (arrow 602). Along with the migration of the VOL 164-5, at least one of the storage control units 252-1 and 252-3 migrates data chunks 5-D1 and 5-D2 in the VOL 164-5 from the physical storage space 563-1 to the physical storage space 563-3. Along with that, at least one of the storage control units 252-1 and 252-3 updates, with respect to each of the relevant data chunks 5-D1 and 5-D2, parities in a stripe including the write destination strip of the relevant data chunk 5-D on the basis of the relevant data chunk 5-D. Incidentally, the VOL migration may be performed by at least one of the storage control units 252-1 and 252-3 instead of or in addition to at least one of the hypervisors 282-1 and 282-3.

What is described above is the application deployment support to maintain the leveling of the intra-node used capacity. As another example of the application deployment support, for example, there is at least one of the following:

The application deployment support unit 165 displays information indicating the intra-node used capacity of each of the nodes 211-1 to 211-4 on a client terminal used by an administrator. Consequently, the administrator can appropriately select any one node 211 of the nodes 211-1 to 211-4 as a location to add the application 251 from the viewpoint of the leveling of the intra-node used capacity.

The application deployment support unit 165 automatically selects any one of the nodes 211-1 to 211-4 as the location to add the application 251, which is a target to be added, on the basis of the intra-node used capacity of each of the nodes 211-1 to 211-4 and deploys the addition target application 251 in the selected node 211. Consequently, the node 211 which is appropriate from the viewpoint of the leveling of the intra-node used capacity is decided as the location to add the addition target application 251.

Incidentally, when adding an application 251, the application deployment support unit 165 may cause the hypervisor 282 for the node 221, which is the location to add the application 251, to create a VM 501 and add the application 251 to that VM 501.

Furthermore, to deploy the application 251 at the node 211 may be to request the hypervisor 282 for the node 211 to create a VM 501 in accordance with a VM file of a VM 501 in which the relevant application 251 has already been installed.

Figure 7:
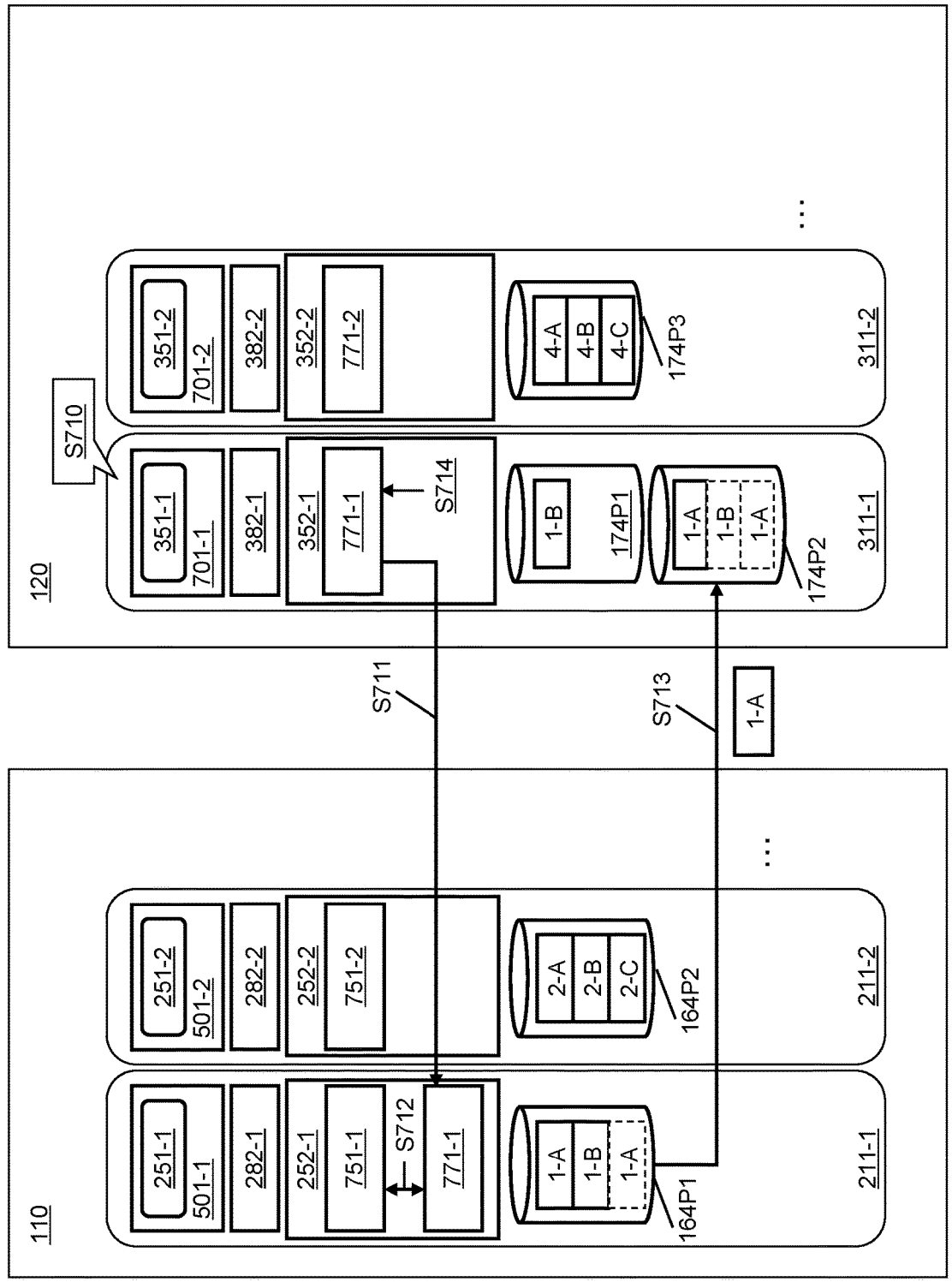
FIG. 7 illustrates an example of remote copy processing including deduplication processing.

FIG. 7 illustrates an example of remote copy processing including deduplication processing. Incidentally, in the explanation of FIG. 7, one lump of data will be called a "data segment" for the sake of convenience.

FIG. 7 illustrates the remote copy processing from the primary data lake system 110 to the secondary data lake system 120. The primary data lake system 110 is an example of a copy source and the secondary data lake system 120 is an example of a copy destination. The remote copy processing illustrated in FIG. 7 can be also applied to either the remote copy processing from the secondary data lake system 120 to the tertiary data lake system 130 or the remote copy processing from the tertiary data lake system 130 to the primary data lake system 110.

The following applies to each node 211. The storage control unit 252 has a function that deduplicate data in a physical storage space of the relevant node 211. The storage control unit 252 manages a deduplication table 751. The deduplication table 751 shows, for example, with respect to each physical address of the physical storage space, a hash value of a data segment stored in an area belonging to the relevant physical address (for example, an example of a summary of the data segment) and one or more logical addresses as a storage location(s) of the relevant data segment (for example, one or more addresses of one or more pool VOLs 164P). According to an example in FIG. 7, two data segments 1-A which are mutually duplicate are stored in a pool VOL 164P1; however, one data segment 1-A is deduplicated from the physical storage space of the node 211-1 by the deduplication function of the storage control unit 252-1.

Regarding each node 311, a deduplication function of the storage control unit 352 is similar to the deduplication function of the storage control unit 252.

As an example of the remote copy processing, remote copy processing for copying a VOL 164P1 of the node 211-1, which is a copy source, to a VOL 174P2 of the node 311-1, which is a copy destination, will be taken as an example.

The remote copy processing according to one comparative example has, for example, the following problems.

- Even if one data segment 1-A is deduplicated, the VOL 164P1 logically stores the two data segments 1-A. Therefore, the copy target includes the two data segments 1-A.
- Even if the data segment 1-B which is duplicate of the data segment 1-B in the copy source VOL 164P1 exists in the copy destination node 311-1, the copy target includes the data segment 1-B. The data segment 1-B is deduplicated at the copy destination node 311-1.

So, the following processing is executed in this embodiment. Incidentally, referring to FIG. 7, data segments expressed with solid lines are data segments stored in the physical storage spaces and data segments expressed with broken lines are data segments which are logically stored in VOL, but not stored in the physical storage spaces (deduplicated data segments).

Firstly, the storage control unit 352-1 enters a read-only mode before starting the remote copy processing (S710). Consequently, at the copy destination node 311-1, the storage control unit 352-1 can read a data segment from the VOL 174P, but cannot write a data segment to the VOL 174P. Therefore, no new segment will be written to the physical storage space(s) of the copy destination node 311-1.

At least one of the storage control units 252-1 and 352-1 copies the deduplication table 771-1 from the node 311-1 to the node 211-1 (S711). Consequently, the storage control unit 252-1 can identify the hash value of the data segment existing in the physical storage space of the copy destination node 311-1 by referring to the copied deduplication table 771-1.

The storage control unit 252-1 identifies the data segment 1-A which does not exist in the physical storage space of the copy destination node 311-1, from among data stored in the copy source VOL 164P1 by comparing the deduplication table 751-1 with the deduplication table 771-1 (S712).

At least one of the storage control units 252-1 and 352-1 copies the data segment 1-A identified in S712 to the copy destination VOL 174P2 (S713). When this happens, the storage control unit 252-1 transmits copy management information, which represents the correspondence relationship between a logical address of the copy source VOL 164P1 and the hash value of the data segment, to the storage control unit 352-1. The storage control unit 352-1 updates the deduplication table 771-1 on the basis of the copy management information and a write destination physical address of the data segment 1-A. Consequently, as illustrated in FIG. 7, the storage control unit 352-1 can manage the existence of two data segments 1-A and one data segment 1-B in the VOL 174P2. Specifically speaking, according to the updated deduplication table 771-1, a new logical address is associated with the physical address where the data segment 1-B exists; and the hash value and two logical addresses of the relevant data segment 1-A are associated with the write destination physical address of the new data segment 1-A.

The size of the copy target can be reduced according to the above-described remote copy processing. Specifically speaking, the following can be realized.

- Even if the two data segments 1-A are logically stored in the VOL 164P1, the two data segments 1-A will not be included in the copy target.
- The data segment 1-B which is duplicate of the data segment 1-B which exists at the copy destination node 311-1 will not be included in the copy target.

An example of tables used in this embodiment will be explained below with reference to FIG. 8 to FIG. 12. Incidentally, at least part of the tables illustrated in FIG. 8 to FIG. 12 may be shared by two or more of the data lake systems 110, 120 and 130.

FIG. 8 illustrates the structure of an AI algorithm management table.

An AI algorithm management table 800 is one of tables managed by the improvement system 181 and the real-time analysis system 161 and is stored in, for example, a specified VOL 184 and a specified VOL 164. The AI algorithm management table 800 retains information about AI algorithms. The AI algorithm management table 800 has a record of every AI algorithm. Each record stores information of an AI algorithm ID 801, an AI-ID 802, a creation date and time 803, a learning dataset ID 804, and an analysis result ID 805. One AI algorithm will be taken as an example (a "focused AI algorithm" in the explanation of FIG. 8).

The AI algorithm ID 801 indicates the ID of the focused AI algorithm. The AI-ID 802 indicates the ID of AI to which the focused AI algorithm belongs. An AI algorithm is improved per AI; and every time an AI algorithm is improved, the AI algorithm ID is assigned to the improved AI algorithm.

The creation date and time 803 indicates a creation date and time of the focused AI algorithm (new or improved AI algorithm). The learning dataset ID 804 indicates the ID of a learning dataset used to create the focused AI algorithm. The analysis result ID 805 indicates the ID of an analysis result using the focused AI algorithm.

FIG. 9 illustrates the structure of an learning dataset management table.

A learning dataset management table 900 is one of tables managed by the improvement system 181 or the tertiary storage control system 182 and is stored in, for example, a specified VOL 184. The learning dataset management table 900 retains information about learning datasets. The learning dataset management table 900 has a record of every learning dataset. Each record stores information of a learning dataset ID 901, a still image date and time 902, a moving image date and time 903, a related date and time 904, and a publication date and time 905. One learning dataset will be taken as an example (a "focused learning dataset" in the explanation of FIG. 9).

The learning dataset ID 901 indicates the ID of the focused learning dataset. The still image date and time 902 indicates the date and time when the still image data included in the focused learning dataset was acquired (for example, the date and time when a snapshot of the still image VOL 184A was acquired). The moving image date and time 903 indicates the date and time when the moving image data included in the focused learning dataset was acquired (for example, the date and time when a snapshot of the moving image VOL 184B was acquired). The related date and time 904 indicates the date and time when the related data included in the focused learning dataset was acquired (for example, the date and time when a snapshot of the related VOL 184C was acquired). The publication date and time 905 indicates the date and time when published data included in the focused learning dataset was acquired (for example, the date and time when a snapshot of the published VOL 184E was acquired).

FIG. 10 illustrates the structure of an analysis result management table.

An analysis result management table 1000 is one of tables managed by the real-time analysis system 161 and is stored in, for example, a specified VOL 164. The analysis result management table 1000 retains information about the analysis results. The analysis result management table 1000 has a record of every analysis result. Each record stores information of an analysis result ID 1001, an analysis date and time 1002, an AI-ID 1003, an AI algorithm ID 1004, and a customer name 1005. One analysis result will be taken as an example (a "focused analysis result" in the explanation of FIG. 10).

The analysis result ID 1001 indicates the ID of the focused analysis result. The analysis date and time 1002 indicates the data and time when the focused analysis result was obtained. The AI-ID 1003 indicates the ID of AI to which an AI algorithm used to acquire the focused analysis result belongs. The AI algorithm ID 1004 indicates the ID of the AI algorithm used to acquire the focused analysis result. The customer name 1005 indicates the ID of a client related to the focused analysis result (for example, a source supplier or a system user).

FIG. 11 illustrates the structure of a node status management table.

A node status management table 1100 is one of tables which exist in each of the data lake systems 110, 120, and 130 and is stored in, for example, a specified VOL in the relevant data lake system. The node status management table 1100 retains information about a node status. The node status management table 1100 has a record of every node. Each record stores information of a node name 1101, an average processor utilization rate 1102, an intra-node free capacity 1103, and an intra-node used capacity 1104. One node 211 will be taken as an example (a "focused node 211" in the explanation of FIG. 11).

The node name 1101 indicates the name of the focused node 211. The average processor utilization rate 1102 indicates an average utilization rate of the processor 265 for the focused node 211. The intra-node free capacity 1103 indicates a free capacity among a physical storage space in the focused node 211. The intra-node used capacity 1104 indicates the used capacity (write capacity) in the physical storage space in the focused node 211. The sum of the intra-node free capacity 1103 and the intra-node used capacity 1104 means the capacity of the physical storage space in the focused node.

FIG. 12 illustrates the structure of a VM management table.

A VM management table 1200 is one of tables which exist in each of the data lake systems 110, 120, and 130, and is stored in, for example, a specified VOL in the relevant data lake system. The VM management table 1200 retains information about VMs 501. The VM management table 1200 has a record of every VM 501. Each record stores information of a VM name 1201, a node name 1202, a VOL capacity 1203, and a VOL used capacity 1204. One VM 501 will be taken as an example (a "focused VM 501" in the explanation of FIG. 12).

The VM name 1201 indicates the name of the focused VM 501. The node name 1202 indicates the name of a node 211 having the focused VM 501. The VOL capacity 1203 indicates the capacity of a VOL 164 mounted in the focused VM 501. The VOL used capacity 1204 indicates a used capacity in the capacity of the VOL 164 mounted in the focused VM 501.

An example of processing executed in this embodiment will be explained below with reference to FIG. 13 to FIG. 22.

Figure 13:
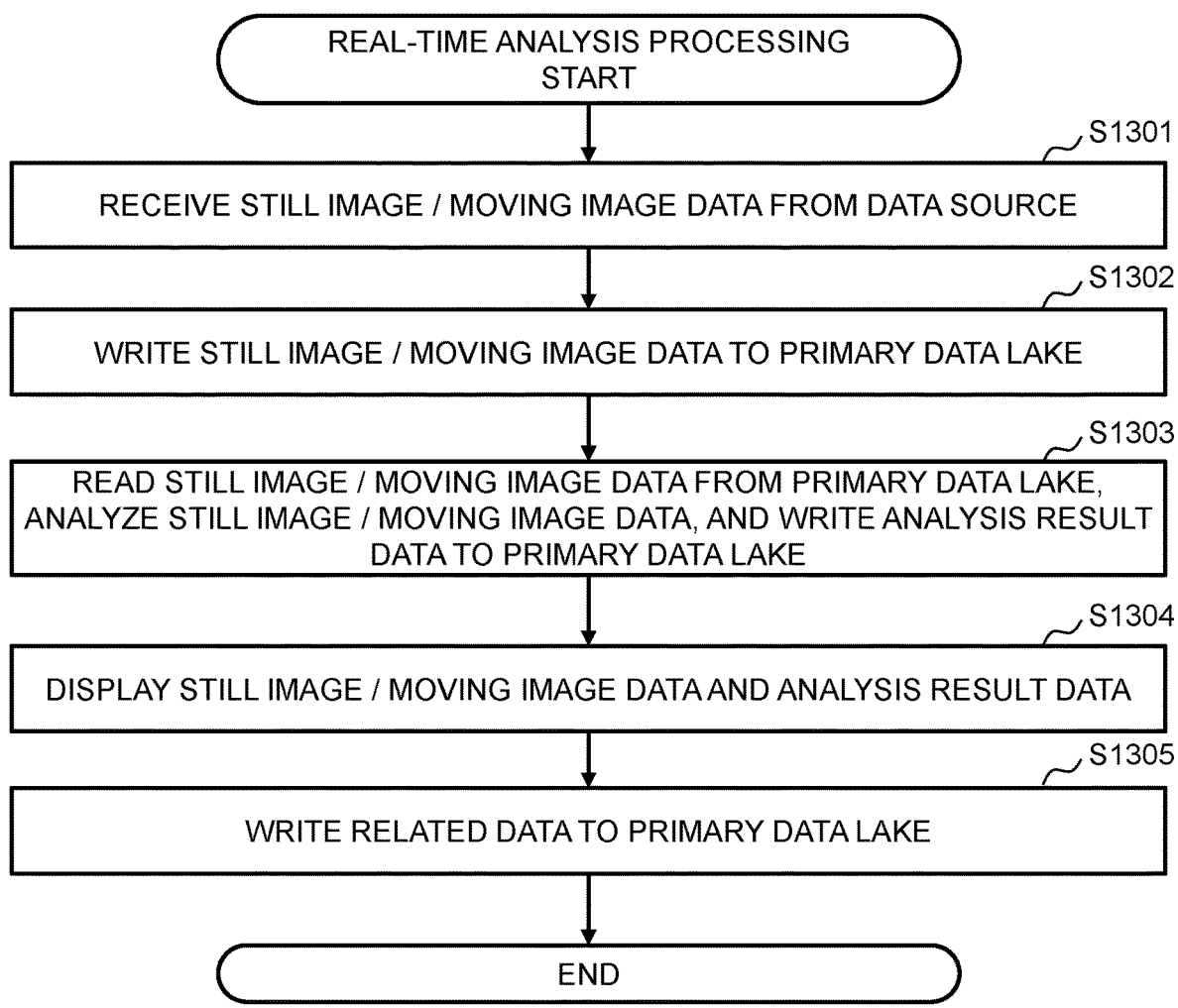
FIG. 13 illustrates a flow of real-time analysis processing.

FIG. 13 illustrates a flow of real-time analysis processing.

The real-time analysis system 161 receives the still image/moving image data from the data source 101 (S1301). The real-time analysis system 161 writes the received still image/moving image data to the primary data lake 163 (the still image VOL 164A and/or the moving image VOL 164B) via the primary storage control system 162 (S1302).

The real-time analysis system 161 reads the written still image/moving image data from the primary data lake 163 via the primary storage control system 162, analyzes the read still image/moving image data, and writes the analysis result data to the primary data lake 163 (the analyzed VOL 164D) via the primary storage control system 162 (S1303). Under this circumstance, the real-time analysis system 161 may update the analysis result management table 1000.

The real-time analysis system 161 displays the still image/moving image data and analysis result data, which represents the analysis result of the relevant data, on a specified display device (S1304). The real-time analysis system 161 writes data which is input in response to the display (an example of the related data) to the primary data lake 163 (the related VOL 164C) via the primary storage control system 162 (S1305).

Figure 14:
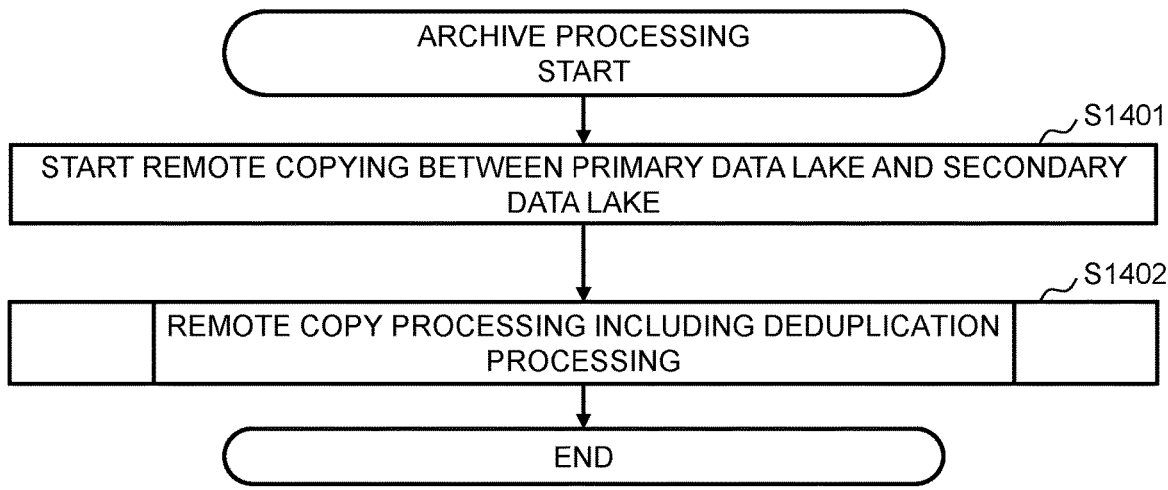
FIG. 14 illustrates a flow of archive processing.

FIG. 14 illustrates a flow of archive processing.

The primary storage control system 162 cooperates with the secondary storage control system 172 and starts remote copying from the primary data lake 163 to the secondary data lake 173 (S1401). Consequently, the remote copy processing including the deduplication processing (see FIG. 22) runs (S1402).

Figure 15:
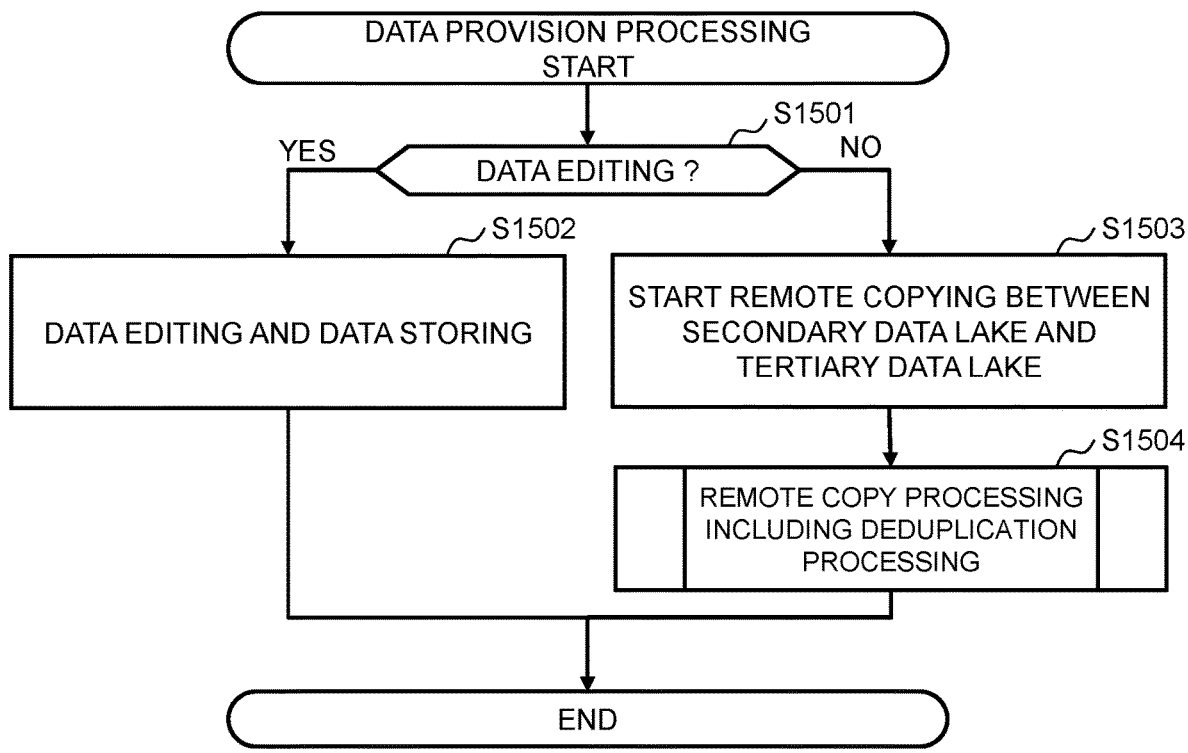
FIG. 15 illustrates a flow of data provision processing.

FIG. 15 illustrates a flow of processing for providing data from the secondary data lake system 120 to the tertiary data lake system 130.

The data editing unit 171 judges whether to execute the data editing or not, for example, whether a data editing condition(s) is satisfied or not (S1501). The data editing condition(s) is the condition(s) to be satisfied when executing the data editing and may be, for example, a condition(s) such as data attributes and a date and time condition or the acceptance of a request for the data editing from an administrator (for example, an administrator of a source supplier, a system supplier, or a system user).

If a judgment result of S1501 is true (S1501: Yes), the data editing unit 171 edits the data read from the secondary data lake 173 and stores the edited data, for example, in the tertiary data lake 183 through the secondary storage control system 172 (S1502). The data editing may be executed in response to the operation by the administrator or automatically.

If a judgment result of S1501 is false (S1501: No), the secondary storage control system 172 cooperates with the tertiary storage control system 182 and starts remote copying from the secondary data lake 173 to the tertiary data lake 183 (S1503). Consequently, the remote copy processing including the deduplication processing (see FIG. 22) runs (S1504).

Figure 16:
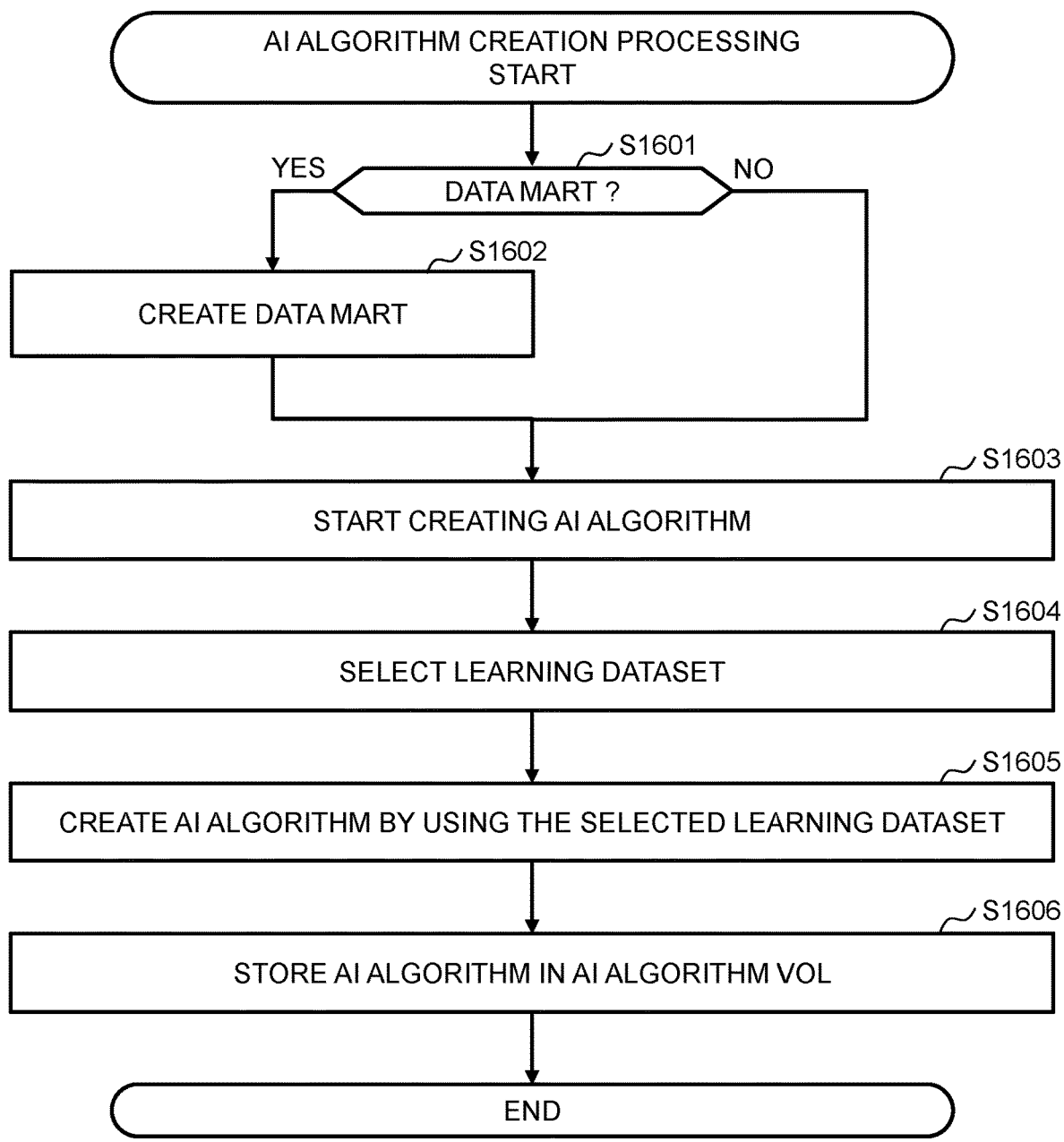
FIG. 16 illustrates a flow of AI algorithm creation processing.

FIG. 16 illustrates a flow of AI algorithm creation processing.

The improvement system 181 judges whether to create a data mart or not, for example, whether a data mart creation condition(s) is satisfied or not (S1601). The data mart creation condition(s) is the condition(s) to be satisfied when creating the data mart VOL 184G and may be, for example, the acceptance of a data mart creation request from the source supplier.

If a judgment result of S1601 is true (S1601: Yes), the ETL unit 187 performs ETL of the data read from the tertiary data lake 183 (for example, partially extracts or edits the data) and stores the data after ETL in the data mart VOL 184G (S1602). The ETL may be executed in response to the operation by the source supplier or automatically.

After S1602 or if a judgment result of S1601 is false (S1601: No), the improvement system 181 displays a list of AI-IDs of selectable AIs for the source supplier, accepts the selection of the AI-ID of the AI which the source supplier wishes to improve, and starts creating an improved AI algorithm for the selected AI (S1603).

The improvement system 181 accepts the selection of the learning dataset from the source supplier (S1604). For example, the improvement system 181 may accept a request from the source supplier to acquire a snapshot of the tertiary data lake 183 (and the data mart VOL 184G) as necessary, manage the snapshot of the tertiary data lake 183 (and the data mart VOL 184G) by using, for example, the learning dataset management table 900, display a list of selectable learning datasets for the source supplier, and accept the selection of the learning dataset desired by the source supplier from the relevant list.

The improvement system 181 creates an improved AI algorithm of the AI selected in S1603 by using the learning dataset selected in S1604 (S1605). The improvement system 181 stores the created AI algorithm in the AI algorithm VOL 184F and updates the AI algorithm management table 800 (S1606).

Figure 17:
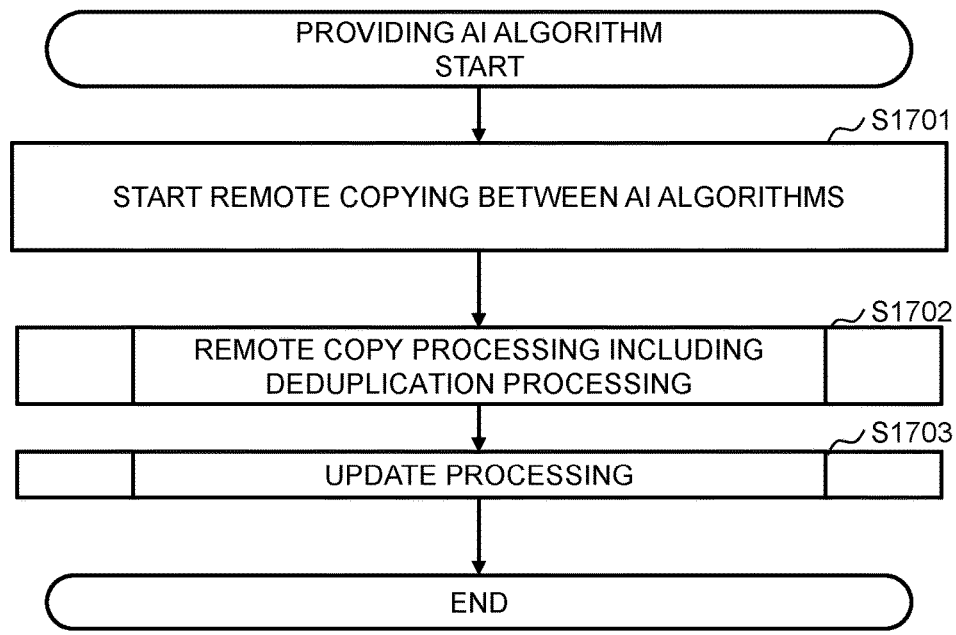
FIG. 17 illustrates a flow of AI algorithm provision processing.

FIG. 17 illustrates a flow of AI algorithm provision processing.

The tertiary storage control system 182 cooperates with the primary storage control system 162 and starts remote copying of the AI algorithm from the AI algorithm VOL 184F, which is a copy source, to the AI algorithm VOL 164E which is a copy destination (S1701). Consequently, the remote copy processing including the deduplication processing (see FIG. 22) runs (S1702) and then the update processing (see FIG. 18) runs (S1703).

Figure 18:
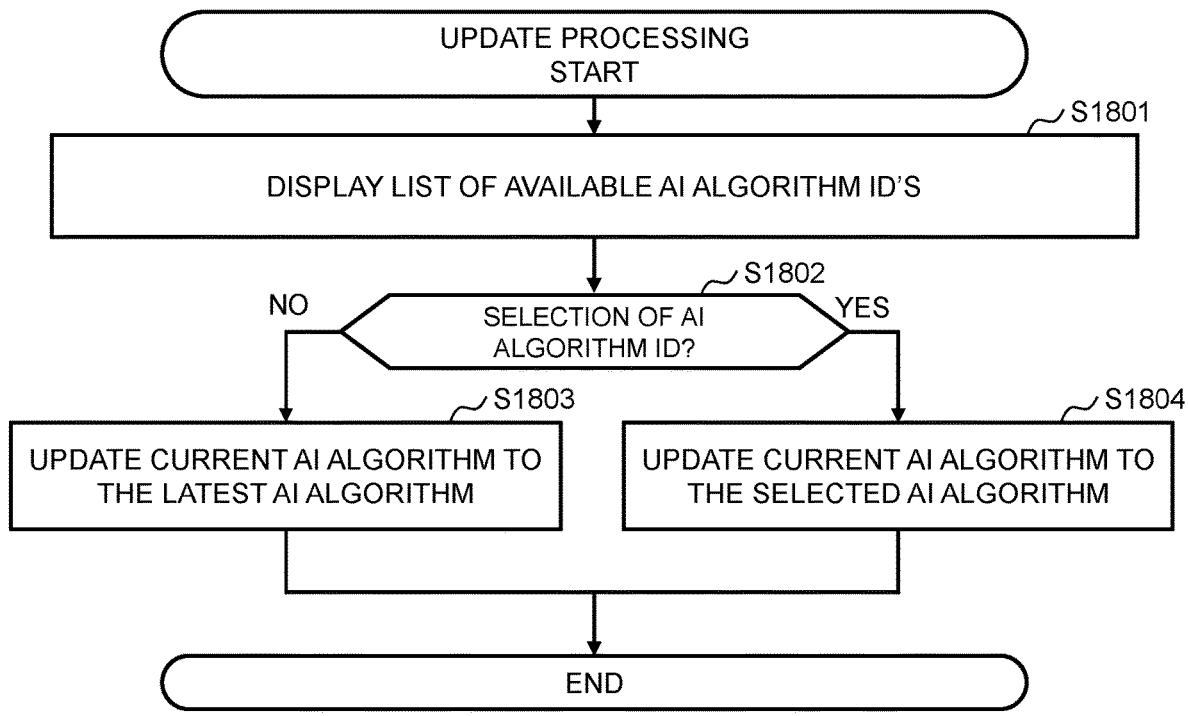
FIG. 18 illustrates a flow of update processing.

FIG. 18 illustrates a flow of update processing.

The real-time analysis system 161 reads the AI algorithm from the AI algorithm VOL 164E, updates the AI algorithm management table 800, and displays a list of AI algorithm IDs of available AI algorithms on, for example, an administrative terminal which is an information processing terminal used by the administrator (for example, the administrator of the system user, the system supplier, or the source supplier).

The real-time analysis system 161 judges whether the selected ID of the AI algorithm is accepted or not (S1802).

If a judgment result of S1802 is false (for example, if an automatic selection is designated by the administrator) (S1802: No), the real-time analysis system 161 refers to the AI algorithm management table, selects an AI algorithm of the latest creation date and time 803 corresponding to the AI-ID to which the current AI algorithm for the real-time analysis system 161 belongs, and updates the current AI algorithm to the selected AI algorithm (S1803).

If a judgment result of S1802 is true (S1802: Yes), the real-time analysis system 161 updates the current AI algorithm for the real-time analysis system 161 to the AI algorithm corresponding to the selected AI algorithm ID (S1804).

Figure 19:
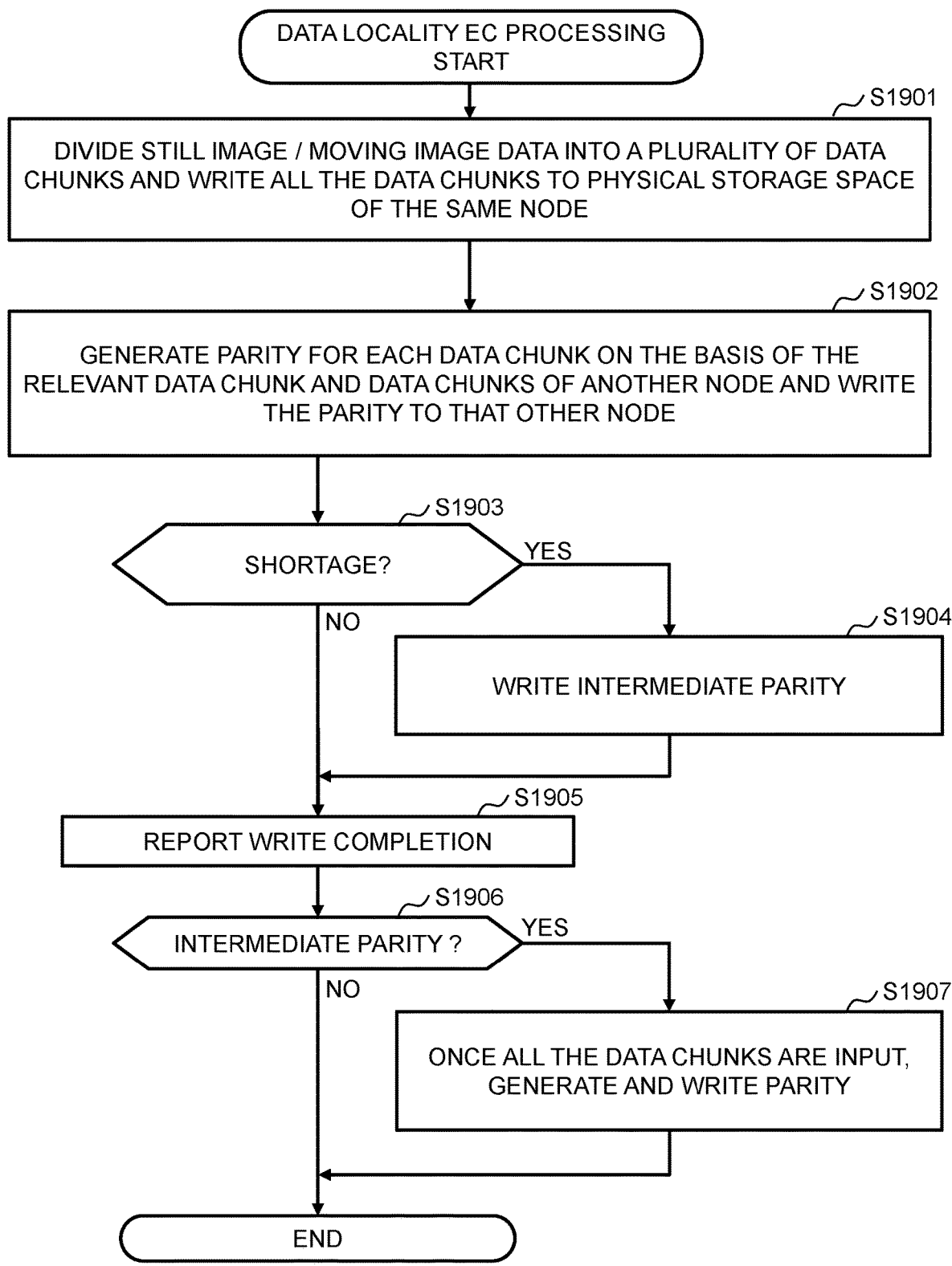
FIG. 19 illustrates a flow of data locality EC processing.

FIG. 19 illustrates a flow of data locality EC processing. The processing illustrated in FIG. 19 can be applied to any one of the storage control systems 162, 172, and 183. The data locality EC processing illustrated in FIG. 5 will be taken below as an example.

The primary storage control system 162 (the storage control unit 252-1) divides the still image/moving image data from the application 251-1 into data chunks 1-D1 to 1-D3 and writes all the data chunks 1-D1 to 1-D3 to the physical storage space 563-1 (S1901).

Regarding each of the data chunks 1-D1 to 1-D3, the primary storage control system 162 generates a parity on the basis of the relevant data chunk 1-D and all other data chunks in a stripe including a write destination strip of the relevant data chunk 1-D and writes the relevant parity to a strip(s) in the relevant stripe (a strip(s) in which no data chunk is stored) (S1902).

The primary storage control system 162 judges whether or not there was any stripe with any shortage of a data chunk(s) in S1902 (S1903). The "shortage of a data chunk(s)" means that at least one data chunk other than the data chunk 1-D is an initial chunk (for example, a zero data chunk whose all bits are "0").

If a judgment result of S1903 is true (S1903: Yes), the primary storage control system 162 generates a parity for the stripe with the shortage of a data chunk(s) by using the initial chunk instead of the data chunk (that is, generating an intermediate parity) and writes the intermediate parity to a write destination strip of the parity (S1904).

After S1904 or if a judgment result of S1903 is false (S1903: No), the primary storage control system 162 notifies the application 251-1, which is a transmission source of the write target still image/moving image data, of the write completion (S1905).

If there is a stripe in which the intermediate parity is stored (S1906: Yes) and if all initial chunks are replaced with data chunks with respect to the relevant stripe, the storage control system 162 changes the intermediate parity to a parity by using the replaced data chunk and replaces the intermediate parity in the strip with the parity (S1907).

Figure 20:
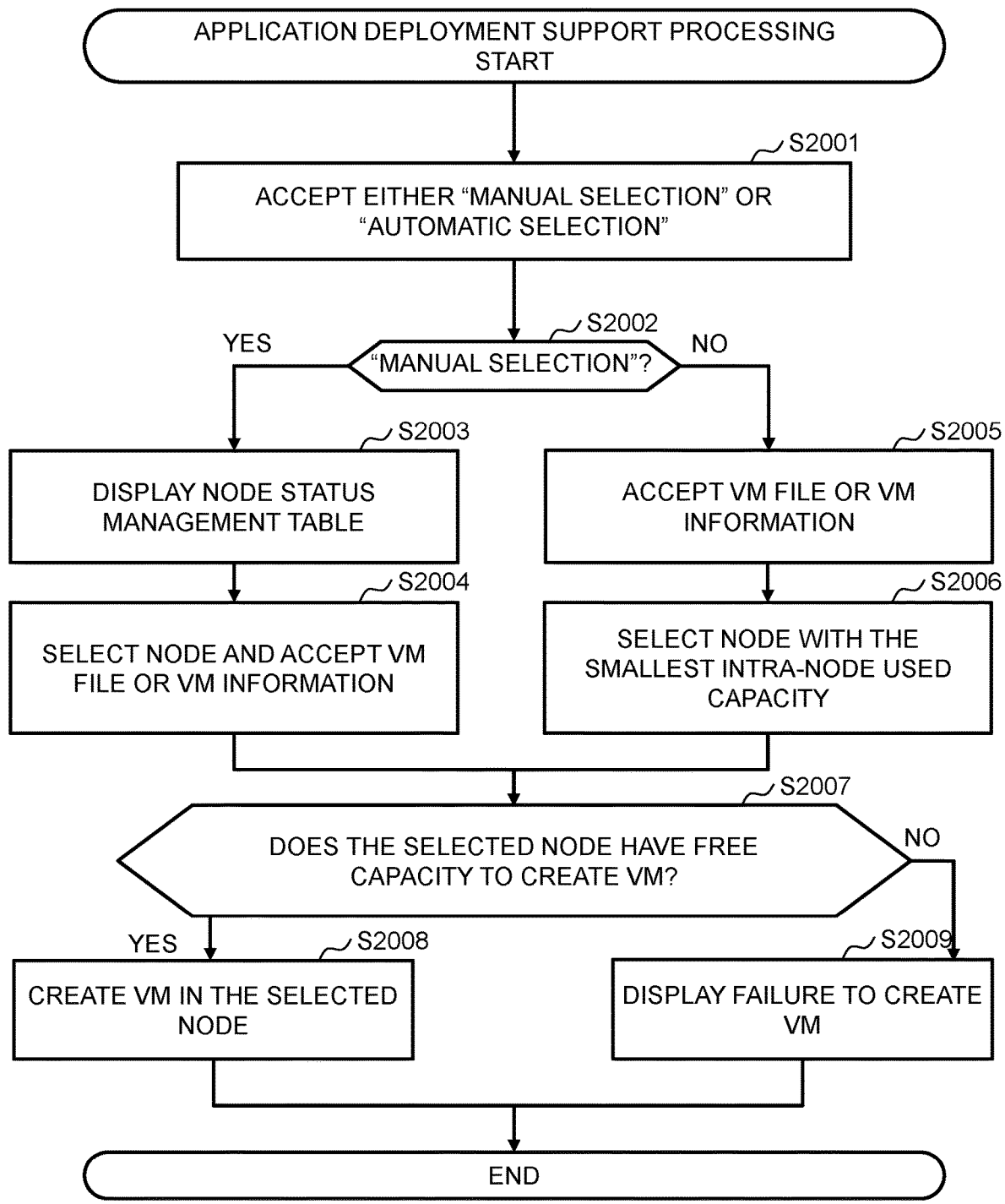
FIG. 20 illustrates a flow of application deployment support processing.

FIG. 20 illustrates a flow of application deployment support processing. The processing illustrated in FIG. 20 can be applied to any one of the data lake systems 110, 120, and 130. The primary data lake system 110 will be taken below as an example. With the primary data lake system 110, the primary storage control system 162 updates the node status management table 1100 as appropriate and the hypervisor 282 updates the VM management table 1200 as appropriate.

The application deployment support unit 165 accepts either "manual selection" or "automatic selection" from the administrator via an administrative terminal.

When the "manual selection" is selected (S2002: Yes), the application deployment support unit 165 displays at least information including the intra-node used capacity 1104 of each node 211 in the node status management table 1100 on the administrative terminal (S2003). The application deployment support unit 165 accepts the selection of the node 211 and a VM file or VM information (for example, information of the VM name, the processor, the memory, and VOL) of the VM 501 to be used from the administrator through the administrative terminal (S2004). The VM file is an image file of the VM 501 (for example, the VM 501 in which the application 251 has been installed).

When the "automatic selection" is selected (S2002: No), the application deployment support unit 165 accepts the VM file or the VM information of the VM 501 to be used from the administrator through the administrative terminal (S2005). The application deployment support unit 165 refers to the node status management table 1100 and selects a node 211 with the smallest intra-node used capacity (S2006).

After S2004 or S2006, the application deployment support unit 165 judges whether or not the selected node 211 has a free capacity to create the VM 501 to be used, on the basis of the intra-node free capacity 1103 of the selected node 211 and the VM file or the VM information (S2007).

If a judgment result of S2007 is true (S2007: Yes), the application deployment support unit 165 creates the VM 501 at the selected node 211 in accordance with the VM file or the VM information (S2008).

If a judgment result of S2007 is false (S2007: No), the application deployment support unit 165 displays information indicating a failure to create the VM on the administrative terminal (S2009).

Figure 21:
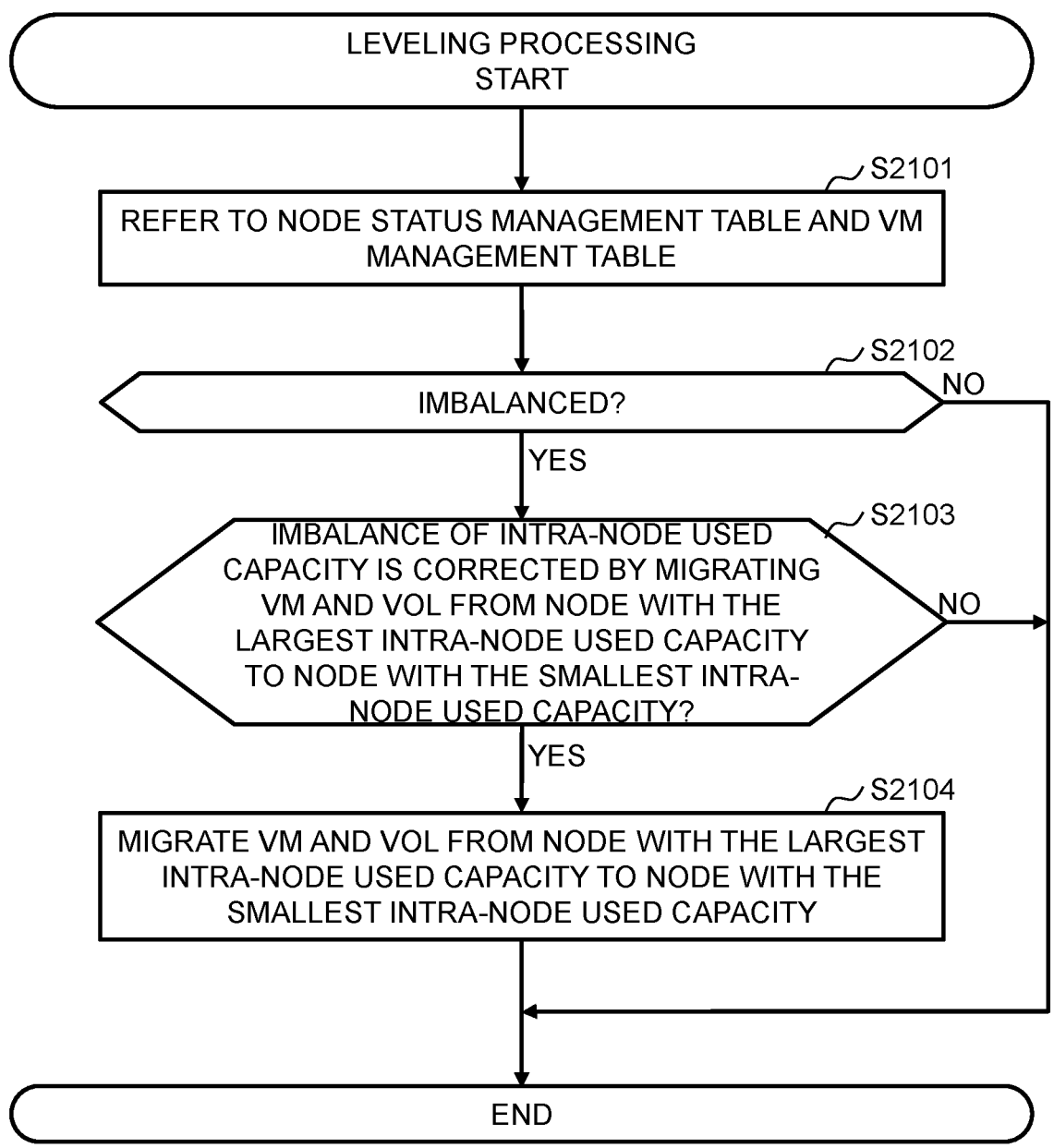
FIG. 21 illustrates a flow of leveling processing.

FIG. 21 illustrates a flow of leveling processing. The processing illustrated in FIG. 21 can be applied to any one of the data lake systems 110, 120, and 130. The processing illustrated in FIG. 6 will be taken below as an example. With the primary data lake system 110, the primary storage control system 162 updates the node status management table 1100 as appropriate and the hypervisor 282 updates the VM management table 1200 as appropriate.

The application deployment support unit 165 refers to the node status management table 1100 and the VM management table 1200 (S2101).

The application deployment support unit 165 judges whether intra-node used capacities are imbalanced or not, that is, whether variations of the intra-node used capacities of a plurality of nodes 211 have reached a certain degree or not (S2102).

If a judgment result of S2102 is true (S2102: Yes), the application deployment support unit 165 judges whether or not the imbalance of the intra-node used capacities can be corrected by migrating the VM 501-5 and the VOL 164-5 from the node 211-1 with the largest intra-node used capacity to the node 211-3 with the smallest intra-node used capacity (S2103).

If a judgment result of S2103 is true (S2103: Yes), the application deployment support unit 165 migrates the VM 501-5 and the VOL 164-5 from the node 211-1 with the largest intra-node used capacity to the node 211-3 with the smallest intra-node used capacity (S2104). Under this circumstance, the node status management table 1100 and the VM management table 1200 are updated.

Figure 22:
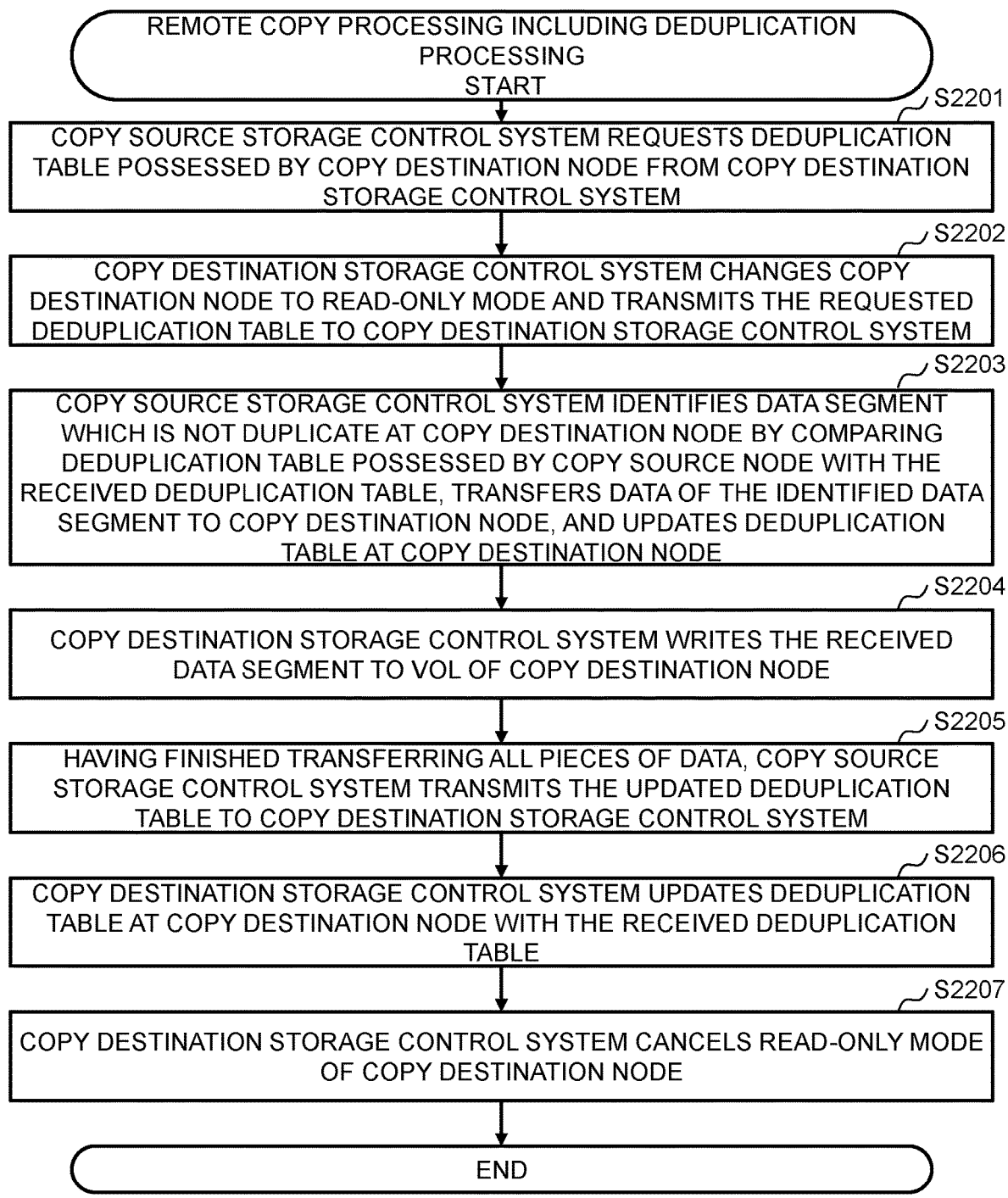
FIG. 22 illustrates a flow of remote copy processing including deduplication processing.

FIG. 22 illustrates a flow of remote copy processing including deduplication processing. The processing illustrated in FIG. 22 can be applied to remote copying from the primary data lake system 110 to the secondary data lake system 120, remote copying from the secondary data lake system 120 to the tertiary data lake system 130, and remote copying from the tertiary data lake system 130 to the primary data lake system 110. The remote copying from the primary data lake system 110 to the secondary data lake system 120 (particularly, the remote copying illustrated in FIG. 7) will be taken below as an example; however, either the secondary storage control system 172 or the tertiary storage control system 182 can become a copy source storage control system and either the tertiary storage control system 182 or the primary storage control system 162 can become a copy destination storage control system.

The copy source storage control system 162 requests the deduplication table 771-1, which is possessed by a copy destination node 311-1, from the copy destination storage control system 172 (S2201).

The copy destination storage control system 172 changes the copy destination node 311-1 (the storage control unit 352-2) to a read-only mode and transmits the requested deduplication table 771-1 to the copy destination storage control system 172 (S2202).

The copy source storage control system 162 identifies a data segment, which is not duplicate at the copy destination node 311-1, in the copy source VOL 164P1 of the copy source node 211-1 by comparing the deduplication table 751-1 possessed by the copy source node 211-1 with the received deduplication table 771-1, transfers the identified data segment to the copy destination node 311-1, and updates the deduplication table 771-1 of the copy destination node (S2203). The copy destination storage control system 172 writes the received data segment to the copy destination VOL 174P2 of the copy destination node 311-1 (S2204).

After the transfer of all pieces of data is completed, the copy source storage control system 162 transmits the updated deduplication table 771-1 to the copy destination storage control system 172 (S2205). The copy destination storage control system 172 updates the deduplication table 771-1 of the copy destination node 311-1 with the received deduplication table 771-1 (S2206). The copy destination storage control system 172 cancels the read-only mode of the copy destination node 311-1 (S2207).

The above-mentioned explanation of the embodiment can be summarized as follows.

The system including the primary data lake system 110 (an example of the first data processing system) which includes the real-time analysis system 161 (an example of the first application system) and the primary storage control system 162 (an example of the first storage control system) at a plurality of nodes 211 constituting the primary IT infrastructure 210 (an example of the computer system) is constructed. Every time the real-time analysis system 161 receives the still image/moving image data from the data source 101, the real-time analysis system 161 is designed to: write the relevant still image/moving image data to the primary data lake 163 (an example of the first logical storage space based on a plurality of physical storage spaces 563 possessed by the plurality of nodes 211); read the relevant still image/moving image data from the primary data lake 163; analyze the read still image/moving image data; and output the result of the analysis. The primary storage control system 162 is designed to execute the data locality EC processing with respect to the data written to the primary data lake 163. The real-time analysis system 161 is at least one application 251 among one or more applications 251 at the plurality of nodes 211. The primary storage control system 162 is a plurality of storage control units 252 at the plurality of nodes 211. Regarding the data locality EC processing with respect to the still image/moving image data received by the real-time analysis system 161, the storage control unit 252-1 at the node 211-1 having the application 251-1 which has received the relevant still image/moving image data writes all the data chunks 1-D1 to 1-D3 (an example of one or more data chunks), which constitute the relevant still image/moving image data, to the physical storage space 563-1 and writes a parity/parities of the relevant data chunk 1-D to the physical storage space 563 at the nodes 211 other than the node 211-1 with respect to each of the data chunks 1-D1 to 1-D3. The number of the parity/parities and the parity write destination node(s) 211 depend on the redundancy configuration. For example, if the redundancy configuration is RAID5 (3D+1P) as illustrated in FIG. 5, there is one parity and the node 211 to which the parity is written varies depending on the data chunk 1-D. According to the data locality EC processing, the still image/moving image data which is the write target of the node 211-1 is stored in the node 211-1 and a plurality of parities P1 to P3 corresponding to the data chunks 1-D1 to 1-D3, respectively, which constitute the relevant still image/ moving image data, are stored in the nodes 211-2 to 211-4 other than the node 211-1. Accordingly, the still image/moving image data can be read from the single node 211-1, so that the inter-node communication is unnecessary and it is thereby possible to realize the high performance (low latency). Furthermore, the EC with the data locality can also realize the high capacity efficiency. Incidentally, with the data locality EC processing, the storage control unit 252-1 at the node 211-1 having the application 251-1 which has received the still image/moving image data generates, for example, the parity P1 of the data chunk 1-D1, among the data chunks 1-D1 to 1-D3 constituting the relevant still image/moving image data, on the basis of the relevant data chunk 1-D and the data chunks 2-D1 and 3-D1 at the nodes 211-2 and 211-3. Accordingly, the parity can be generated by using the data chunks stored in other nodes 211.

The system may include the secondary data lake system 120 (an example of the second data processing system) in the secondary IT infrastructure 310 (an example of the second computer system). The primary data lake system 110 may be included in an edge system. The secondary data lake system 120 may be included in a core system. The secondary data lake system 120 may include the secondary storage control system 172 (an example of the second storage control system) for managing the secondary data lake 173 (an example of the second logical storage space based on one or more physical storage spaces possessed by the secondary IT infrastructure 310). At least one of the storage control systems 162 and 172 may perform the remote copy processing including copying of at least part of data from the primary data lake 163 to the secondary data lake 173. Accordingly, the data of the primary data lake 163 can be archived in the secondary data lake 173, so that the archived data may be deleted from the primary data lake 163 and, therefore, the physical storage capacity of the primary IT infrastructure 210 may be small.

The storage control unit 252 at each node 211 may be designed to eliminate any duplicate data in the physical storage space of the relevant node 211 by using the deduplication table 751 (an example of the first deduplication information which is information indicating the relationship between addresses and data in the node 211 having the relevant storage control unit 252). Similarly, the storage control unit 352 at each node 311 may be designed to eliminate any duplicate data in the physical storage space of the relevant node 211 by using the deduplication table 771 (an example of the second deduplication information which is information indicating the relationship between addresses and data in the node 311 having the relevant storage control unit 352). At least one of the copy source storage control unit 252-1 and the copy destination storage control unit 352-1 (for example, the storage control unit 252-1 according to the example in FIG. 7) may identify the data segment 1-A, which is not duplicate of the data segment 1-B at the copy destination, among the data segments 1-A and 1-B at the copy source by using the deduplication tables 751-1 and 771-1 and copy the identified data segment 1-A from the VOL 164P1 to the VOL 174P2. Consequently, the data size of the copy target can be reduced. Specifically speaking, the copy destination storage control unit 352-1 may enter the read-only mode before starting the remote copy processing and then the remote copy processing may be performed. Consequently, it is possible to prevent the increase of a new data segment(s) in the copy destination node 311-1 during the remote copy processing; and, as a result, it is possible to avoid the generation of a data segment, which is duplicate of a data segment included in the copy target, at the copy destination node 311-1 during the remote copy processing (the necessity for the copy destination node 311-1 to execute the deduplication processing).

The improvement system 181 (an example of the second application system) may be provided in the tertiary data lake system 130 which is provided in the tertiary IT infrastructure 410 (an example of the third computer system). The improvement system 181 may be provided in the secondary data lake system 120 instead of the tertiary data lake system 130. The primary data lake system 110 may manage the AI algorithm VOL 164E (an example of the first model space) in which an AI algorithm (an example of a learning model) is stored. The real-time analysis system 161 may be designed to analyze the still image/moving image data which is read from the primary data lake 163 by using the AI algorithm VOL in the AI algorithm VOL 164E. The improvement system 181 may update the AI algorithm on the basis of at least part of the data copied to the secondary data lake 173. The updated AI algorithm may be stored in the AI algorithm VOL 164E. Accordingly, the AI algorithm will be updated by using at least part of the data archived from the primary data lake 163, so that enhancement of the analysis accuracy can be expected.

The secondary data lake system 120 may include the data editing unit 171. The data editing unit 171 may edits at least part of data in the secondary data lake 173 and store the edited data in the tertiary data lake 183 (an example of the third logical storage space). The improvement system 181 may update the AI algorithm by using the data stored in the tertiary data lake 183. Accordingly, the update of the AI algorithm is conducted on the basis of the tertiary data lake 183 which is a data lake separate from the secondary data lake 173 and in which the data edited by the data editing unit 171 is stored, so that further enhancement of the analysis accuracy can be expected. Incidentally, the data editing unit 171 may be provided in the tertiary data lake system 130 instead of the secondary data lake system 120 or the tertiary data lake 183 may be provided in the secondary data lake system 120 instead of the tertiary data lake system 130. Furthermore, the data editing unit 171 may exclude data which satisfies a non-disclosable data attribute condition, from the data stored in the tertiary data lake 183. Consequently, it is possible to avoid the non-disclosable data from being stored in the tertiary data lake 183 and being browsed by the source supplier.

The tertiary storage control system 182 (or the secondary storage control system 172) may acquire a snapshot of the tertiary data lake 183. The improvement system 181 may update the AI algorithm by using the snapshot of the tertiary data lake 183. Consequently, even if an update frequency of the tertiary data lake 183 is high, the AI algorithm can be easily updated.

The improvement system 181 may store the updated AI algorithm in the AI algorithm VOL 184F (an example of the second model space) managed by the tertiary data lake system 130. At least one of the primary storage control system 162 and the tertiary storage control system 182 may execute the remote copy processing for copying the updated AI algorithm from the AI algorithm VOL 184F to the AI algorithm VOL 164E. Consequently, it is possible to expect automatization of a sequence of processing for storing the still image/moving image data in the primary data lake 163, archiving data from the primary data lake 163 to the secondary data lake 173, storing the data from the secondary data lake 173 to the tertiary data lake 183, updating the AI algorithm on the basis of the tertiary data lake 183, and storing the updated AI algorithm from the AI algorithm VOL 184F to the AI algorithm VOL 164E. Incidentally, if the secondary data lake system 120 instead of the tertiary data lake system 130 has the improvement system and the AI algorithm VOL 184F, at least one of the primary storage control system 162 and the secondary storage control system 182 may execute the remote copy processing for copying the updated AI algorithm from the AI algorithm VOL 184F to the AI algorithm VOL 164E.

The data stored in the primary data lake 163 may include the analysis result data indicating the analysis result. The analysis result data may be archived in the secondary data lake 173 and the source supplier may be able to browse at least part of the analysis result data. Consequently, it is possible to verify whether or not the AI algorithm performed as expected.

The primary data lake system 110 may include the application deployment support unit 165 which supports the optimization of deployment of the application 251. At least one of the following may be adopted. Incidentally, the following may be applied to each of the application deployment support units 175 and 185 instead of or in addition to the application deployment support unit 165.

The application deployment support unit 165 may display information indicating the intra-node used capacity (an example of the write amount) of each of the plurality of nodes 211. The administrator who browses the relevant displayed information (for example, the administrator of the system supplier, the system user, or the source supplier) can judge which node 211 would be an optimum place to deploy the application 251 which is a target to be added.

The application deployment support unit 165 may decide the node 211 with the smallest intra-node used capacity, among the plurality of nodes 211, as a deployment location of a deployment target application 251. Consequently, the optimum node 211 as the deployment location of the application 251 is decided automatically.

When variations of the intra-node used capacities of the plurality of nodes 211 have reached a certain degree, the application deployment support unit 165 causes at least one of the hypervisors 282-1 and 282-3 (an example of the execution environment management unit) to select a migration target VM 501-5 from a migration source node 211-1 with the largest intra-node used capacity, select a migration destination node 211-3 for the selected VM 501-5, migrate the selected VM 501-5 from the migration source node 211-1 to the migration destination node 211-3, and also migrate a VOL 165-5 which is mounted in the relevant VM 501-5, from the migration source node 211-1 to the migration destination node 211-3. Consequently, even if variations of the intra-node used capacities of the plurality of nodes 211 have reached a certain degree during the operation, it is possible to maintain the optimum deployment of the applications 251.

One embodiment has been explained above; however, this embodiment has been exemplified in order to explain the present invention and it is not intended to limit the scope of the present invention to only this embodiment. The present invention can be also implemented according to various other aspects.

For example, regarding the application execution environment, other types of execution environments such as containers may be adopted instead of VMs.

Furthermore, for example, the present invention may be applied to a computer system other than the edge system which performs the real-time analysis. Specifically speaking, for example, the following systems may be adopted.

Expression 1

A system including a first storage control system at a plurality of first node computers constituting a first computer system, wherein the first storage control system is designed to execute data locality EC processing, which is write processing as EC (Erasure Coding) with data locality, with respect to data written to a first logical storage space based on a plurality of first physical storage spaces possessed by the plurality of first node computers;

wherein the storage control system is a plurality of first storage control units at the plurality of first node computers;

wherein regarding the data locality EC processing, a first storage control unit for a first node computer writes all of one or more data chunks, which constitute write target data at the first node computer, to a first physical storage space in the first node computer, and writes a parity of the data chunk, with respect to each of the one or more data chunks, to the first physical storage space(s) of the first node computer(s) other than the first node computer.

Expression 2

The system according to Expression 1 including a second data processing system provided in a second computer system, wherein the second data processing system includes a second storage control system for managing a second logical storage space based on one or more second physical storage spaces possessed by the second computer system; and wherein at least one storage control system of the first storage control system and the second storage control system executes remote copy processing including copying of at least part of data from the first logical storage space to the second logical storage space.

Expression 3

The system according to Expression 2, wherein with the first storage control system, each first storage control unit is designed to eliminate duplicate data in the first physical storage space by using first deduplication information which is information indicating a relationship between addresses and data in the first node computer which possesses the first storage control unit;

wherein the second storage control system is designed to eliminate duplicate data in the one or more second physical storage spaces by using second deduplication information which is information indicating a relationship between addresses and data in the second computer system; and wherein regarding the remote copy processing, the at least one storage control system identifies data which is not duplicate of data at a copy destination, among data at a copy source, by using the first deduplication information and the second deduplication information and copies the identified data from the first logical storage space to the second logical storage space.

Expression 4

The system according to Expression 3,
wherein the second computer system includes a plurality of second node computers, each of which includes the plurality of second physical storage spaces;
wherein the second storage control system is a plurality of second storage control units at the plurality of second node computers;
wherein the first logical storage space includes at least one first logical volume among a plurality of first logical volumes in the plurality of first node computers;
wherein the second logical storage space includes at least one second logical volume among a plurality of second logical volumes in the plurality of second node computers;
wherein the remote copy processing is processing for copying data from a copy source first node computer where a copy source first logical volume exists, to a copy destination second logical volume of a copy destination second node computer;
wherein the first deduplication information is information indicating a relationship between addresses and data in the copy source first node computer;
wherein the second deduplication information is information indicating a relationship between addresses and data in the copy destination second node computer;
wherein a copy destination second storage control unit, which is a second storage control unit for the copy destination second node computer, makes the copy destination second node computer enter a read-only mode before the remote copy processing is started; and
wherein in the remote copy processing,
at least one storage control unit of the copy source second storage control unit and a copy source first storage control unit, which is the first storage control unit at the copy source first node computer, copies the second deduplication information from the copy destination second node computer to the copy source first node computer;
the copy source first storage control unit identifies data which does not exist in a physical storage space in the copy destination second node computer, among data stored in the copy source first logical volume, by using the copied second deduplication information and the first deduplication information;
the at least one storage control unit copies the identified data to the copy destination second logical volume; and
the copy destination second storage control unit updates the second deduplication information.

Expression 5

The system according to Expression 1,
wherein regarding the data locality EC processing, the first storage control unit for the first node computer generates a parity of the data chunk, with respect to each of one or more data chunks constituting write target data in the first node computer, on the basis of the data chunk and one or more data chunks possessed by one or more first node computers other than the first node computer.

Expression 6

The system according to Expression 1,
further including an application deployment support unit that supports optimization of deployment of a plurality of applications at the plurality of first node computers,
wherein the application deployment support unit displays information indicating a write amount of each of the plurality of first node computers.

Expression 7

The system according to Expression 1,
further including an application deployment support unit that supports optimization of deployment of a plurality of applications at the plurality of first node computers,
wherein the application deployment support unit decides a first node computer with the smallest write amount, among the plurality of first node computers, as a deployment location of a deployment target application.

Expression 8

The system according to Expression 1,
further including an application deployment support unit that supports optimization of deployment of a plurality of applications at the plurality of first node computers,
wherein the plurality of applications are executed in a plurality of execution environments at the plurality of first node computers;
wherein regarding each of the plurality of execution environments, at least one logical volume in a first node computer having the execution environment is mounted in the execution environment; and
wherein when variations of a write amount of the plurality of first node computers have reached a certain degree, the application deployment support unit:
selects a migration target execution environment from a migration source first node computer which is a first node computer with the largest write amount;
selects a migration destination first node computer of the selected migration target execution environment; and
causes an execution environment management unit to migrate the selected migration target execution environment from the migration source first node computer to the migration destination first node computer and also migrate a logical volume which is mounted in the migration target execution environment, from the migration source first node computer to the migration destination first node computer.

Furthermore, in the above-mentioned explanation, the still image/moving image data is an example of the multidimensional data. Sound data or other multidimensional data may be adopted as other examples of the multidimensional data. For example, in recent years, dimensions of the data have been being diversified. For example, regarding image sensors, there are spectral imaging for acquiring multi-wavelength data and distance measurement by a TOF (Time Of Flight) camera and data acquired from these sensors is also the multidimensional data.

What is claimed is:

1. A system comprising a first data processing system including a first application system and a first storage control system at a plurality of first node computers constituting a first computer system,
wherein every time the first application system receives multidimensional data from a data source, the first application system is configured to write the multidimensional data to a first logical storage space based on a plurality of first physical storage spaces possessed by the plurality of first node computers, read the multidimensional data from the first logical storage space, analyze the read multidimensional data, and output a result of the analysis;

wherein the first storage control system is configured to execute data locality EC processing, which is write processing as EC (Erasure Coding) with data locality, with respect to data written to the first logical storage space;

wherein the first application system is at least one application of one or more applications for the plurality of first node computers;

wherein the first storage control system is a plurality of first storage control units at the plurality of first node computers; and wherein regarding the data locality EC processing with respect to the multidimensional data received by the first application system, a first storage control unit for a first node computer having an application which has received the multidimensional data writes all of one or more data chunks constituting the multidimensional data to a first physical storage space in the first node computer, generates a parity of the data chunk, with respect to each of the one or more data chunks, on the basis of the data chunk and one or more data chunks possessed by one or more first node computers other than the first node computer, and writes the generated parity to a first physical storage space in a first node computer other than the first node computer.

2. The system according to claim 1, comprising a second data processing system provided in a second computer system, wherein the first computer system is included in an edge system;

wherein the second computer system is included in a core system;

wherein the second data processing system includes a second storage control system for managing a second logical storage space based on one or more second physical storage spaces possessed by the second computer system; and wherein at least one of the first storage control system and the second storage control system executes remote copy processing including copying of at least part of data from the first logical storage space to the second logical storage space.

3. The system according to claim 2, wherein with the first storage control system, each first storage control unit is configured to eliminate duplicate data in the first physical storage space in a first node computer which possesses the first storage control unit by using first deduplication information which is information indicating a relationship between addresses and data in the first node computer;

wherein the second storage control system is configured to eliminate duplicate data in the one or more second physical storage spaces by using second deduplication information which is information indicating a relationship between addresses and data in the second computer system; and wherein regarding the remote copy processing, the at least one storage control system identifies data which is not duplicate of data at a copy destination, among data at a copy source, by using the first deduplication information and the second deduplication information and copies the identified data from the first logical storage space to the second logical storage space.

4. The system according to claim 3, wherein the second computer system includes a plurality of second node computers, each of which includes the plurality of second physical storage spaces;

wherein the second storage control system is a plurality of second storage control units at the plurality of second node computers;

wherein the first logical storage space includes at least one first logical volume among a plurality of first logical volumes in the plurality of first node computers;

wherein the second logical storage space includes at least one second logical volume among a plurality of second logical volumes in the plurality of second node computers;

wherein the remote copy processing is processing for copying data from a copy source first node computer where a copy source first logical volume exists, to a copy destination second logical volume of a copy destination second node computer;

wherein the first deduplication information is information indicating a relationship between addresses and data in the copy source first node computer;

wherein the second deduplication information is information indicating a relationship between addresses and data in the copy destination second node computer;

wherein a copy destination second storage control unit, which is a second storage control unit for the copy destination second node computer, enters a read-only mode before the remote copy processing is started; and wherein in the remote copy processing, at least one of the copy source first storage control unit and the copy destination second storage control unit copies the second deduplication information from the copy destination second node computer to the copy source first node computer;

the copy source first storage control unit identifies data which does not exist in a physical storage space in the copy destination second node computer, among data stored in the copy source first logical volume, by using the copied second deduplication information and the first deduplication information; and at least one of the copy source first storage control unit and the copy destination second storage control unit copies the identified data to the copy destination second logical volume.

5. The system according to claim 2, wherein the second data processing system or a third data processing system provided in a third computer system, which is different from the first computer system and the second computer system, includes a second application system;

wherein the first data processing system manages a first model space which is a logical storage space different from the first logical storage space and in which a learning model is stored;

wherein the first application system is configured to analyze the read multidimensional data by using the learning model in the first model space;

wherein the second application system updates the learning model on the basis of at least part of the data copied to the second logical storage space; and wherein the updated learning model is stored in the first model space.

6. The system according to claim 5, wherein the second data processing system or the third data processing system includes a data editing unit, wherein the data editing unit edits at least part of data in the second logical storage space and stores the edited data in a third logical storage space included in the second computer system or the third computer system; and wherein the second application system updates the learning model by using the data stored in the third logical storage space.

7. The system according to claim 6,
wherein the second storage control system or a third storage control system possessed by the third data processing system acquires a snapshot of the third logical storage space; and
wherein the second application system updates the learning model by using the snapshot of the third logical storage space.

8. The system according to claim 5,
wherein the second application system stores the updated learning model in a second model space managed by the second data processing system or the third data processing system; and
wherein at least one storage control system of the first storage control system and the second storage control system or at least one storage control system of the first storage control system and a third storage control system included in the third computer system copies the updated learning model from the second model space to the first model space.

9. The system according to claim 2,
wherein the data stored in the first logical storage space includes data indicating the result of the analysis.

10. The system according to claim 1,
further comprising an application deployment support unit that supports optimization of application deployment,
wherein the application deployment support unit displays information indicating a write amount of each of the plurality of first node computers.

11. The system according to claim 1,
further comprising an application deployment support unit that supports optimization of application deployment,
wherein the application deployment support unit decides a first node computer with the smallest write amount, among the plurality of first node computers, as a deployment location of a deployment target application.

12. The system according to claim 1,
further comprising an application deployment support unit that supports optimization of application deployment,
wherein the plurality of applications are executed in a plurality of execution environments at the plurality of first node computers;
wherein regarding each of the plurality of execution environments, at least one logical volume in a first node computer having the execution environment is mounted in the execution environment; and wherein when variations of a write amount of the plurality of first node computers have reached a certain degree, the application deployment support unit:
selects a migration target execution environment from a migration source first node computer which is a first node computer with the largest write amount;
selects a migration destination first node computer of the selected migration target execution environment; and
causes an execution environment management unit to migrate the selected migration target execution environment from the migration source first node computer to the migration destination first node computer and also migrate a logical volume which is mounted in the migration target execution environment, from the migration source first node computer to the migration destination first node computer.

13. The system according to claim 5,
further comprising a data editing unit included in the second computer system or the third computer system,
wherein the data editing unit excludes data which falls under a condition of a non-disclosable data attribute, from data stored in a third logical storage space included in the second computer system or the third computer system.

14. A method executed every time a first computer system including a plurality of first node computers receives multidimensional data from a data source, for:
(a) writing the multidimensional data to a first logical storage space based on a plurality of first physical storage spaces possessed by the plurality of first node computers;
(b) reading the multidimensional data from the first logical storage space;
(c) analyzing the read multidimensional data; and
(d) outputting a result of the analysis,
wherein (a) writing is data locality EC processing which is write processing as EC (Erasure Coding) with data locality; and
wherein with the first node computer which has received the multidimensional data, the data locality EC processing is to: write all of one or more data chunks constituting the multidimensional data to a first physical storage space in the first node computer; generate a parity of the data chunk, with respect to each of the one or more data chunks, on the basis of the data chunk and one or more data chunks possessed by one or more first node computers other than the first node computer; and write the generated parity to a first physical storage space for a first node computer other than the first node computer.

* * * * *